(12) United States Patent
Takagi et al.

(10) Patent No.: US 7,507,458 B2
(45) Date of Patent: Mar. 24, 2009

(54) SEMI-REFLECTIVE FILM AND REFLECTIVE FILM FOR OPTICAL INFORMATION RECORDING MEDIUM, OPTICAL INFORMATION RECORDING MEDIUM, AND SPUTTERING TARGET

(75) Inventors: Katsutoshi Takagi, Kobe (JP); Yuuki Tauchi, Kobe (JP); Junichi Nakai, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 396 days.

(21) Appl. No.: 11/168,497

(22) Filed: Jun. 29, 2005

(65) Prior Publication Data

US 2005/0287333 A1 Dec. 29, 2005

(30) Foreign Application Priority Data

Jun. 29, 2004 (JP) ............................. 2004-190704

(51) Int. Cl.
*B32B 3/02* (2006.01)
(52) U.S. Cl. ................. 428/64.1; 428/64.4; 430/270.12
(58) Field of Classification Search ................ 428/64.1, 428/64.4; 430/270.12
See application file for complete search history.

(56) References Cited

U.S. PATENT DOCUMENTS

| 4,810,308 | A | 3/1989 | Eagar et al. |
| 5,637,411 | A | 6/1997 | Shimazaki et al. |
| 5,948,497 | A | 9/1999 | Hatwar et al. |
| 6,007,889 | A | 12/1999 | Nee |
| 6,280,811 | B1 | 8/2001 | Nee |
| 6,544,616 | B2 * | 4/2003 | Nee ........................... 428/64.1 |
| 6,689,444 | B2 * | 2/2004 | Nakai et al. ................. 428/64.1 |
| 7,018,696 | B2 * | 3/2006 | Nee ........................... 428/64.1 |
| 2003/0143342 | A1 | 7/2003 | Fujii et al. |
| 2003/0227250 | A1 | 12/2003 | Nee |
| 2004/0028912 | A1 | 2/2004 | Tauchi et al. |
| 2004/0226818 | A1 | 11/2004 | Takagi et al. |
| 2004/0238356 | A1 | 12/2004 | Matsuzaki et al. |
| 2004/0263984 | A1 | 12/2004 | Nakai et al. |
| 2005/0008883 | A1 | 1/2005 | Takagi et al. |
| 2005/0112019 | A1 | 5/2005 | Nakai et al. |
| 2005/0170132 | A1 * | 8/2005 | Nee ........................... 428/64.4 |
| 2005/0287333 | A1 | 12/2005 | Takagi et al. |

FOREIGN PATENT DOCUMENTS

| EP | 1 174 868 A2 | 1/2002 |
| JP | 4-28032 | 1/1992 |
| JP | 5-258363 | 10/1993 |
| JP | 6-208732 | 7/1994 |
| JP | 6-208732 A | 7/1994 |
| JP | 10-162435 | 6/1998 |
| JP | 2002-15464 | 1/2002 |
| JP | 2002-117587 | 4/2002 |
| JP | 2004-6051 | 1/2004 |
| KR | 10-2004-0014362 | 2/2004 |

OTHER PUBLICATIONS

U.S. Appl. No. 10/844,345, filed May 13, 2004, Takagi et al.
U.S. Appl. No. 10/999,027, filed Nov. 30, 2004, Takagi et al.
U.S. Appl. No. 11/103,615, filed Apr. 12, 2005, Takagi et al.
U.S. Appl. No. 11/333,492, filed Jan. 18, 2006, Tauchi et al.
U.S. Appl. No. 11/375,036, filed Mar. 15, 2006, Tauchi et al.
U.S. Appl. No. 11/428,045, filed Jun. 30, 2006, Fujii et al.
U.S. Appl. No. 11/425,062, filed Jun. 19, 2006, Tauchi et al.
U.S. Appl. No. 11/425,068, filed Jun. 19, 2006, Nakai et al.
U.S. Appl. No. 11/612,791, filed Dec. 19, 2006, Nakano et al.
U.S. Appl. No. 12/167,597, filed Jul. 3, 2008, Takagi et al.
U.S. Appl. No. 12/183,700, filed Jul. 31, 2008, Tauchi et al.
U.S. Appl. No. 12/198,520, filed Aug. 26, 2008, Tauchi et al.

* cited by examiner

*Primary Examiner*—Elizabeth Mulvaney
(74) *Attorney, Agent, or Firm*—Oblon, Spivak, McClelland, Maier & Neustadt, P.C.

(57) ABSTRACT

Each of a semi-reflective film or reflective film for an optical information recording medium, and a Ag based alloy sputtering target includes a Ag based alloy containing 0.01 to 10 atomic percent of Li. The Ag based alloy exhibits high cohesion resistance, high light resistance, high heat resistance, high reflectivity, high transmissivity, low absorptivity, and high thermal conductivity of the level which had not been realized by the pure Ag or by the conventional Ag alloys. The resulting semi-reflective film and reflective film for an optical information recording medium containing the Ag based alloy exhibit excellent writing/reading properties and long term reliability. The sputtering target for an optical information recording medium is used in depositing the semi-reflective film and the reflective film. Using the semi-reflective film and/or the reflective film, an optical information recording medium is manufactured.

18 Claims, No Drawings

SEMI-REFLECTIVE FILM AND REFLECTIVE FILM FOR OPTICAL INFORMATION RECORDING MEDIUM, OPTICAL INFORMATION RECORDING MEDIUM, AND SPUTTERING TARGET

BACKGROUND OF THE INVENTION

1. Field of the Invention

The present invention relates to a semi-reflective film and a reflective film for an optical information recording medium which has a high cohesion resistance, high light resistance, and high heat resistance simultaneously with a high reflectivity, high transmissivity, low absorptivity, and high thermal conductivity in the field of optical information recording media such as compact disc (CD), digital versatile disc (DVD), Blu-ray Disc, and HD DVD. It also relates to a sputtering target for an optical information recording medium which is used in depositing the semi-reflective film or reflective film; and an optical information recording medium having the semi-reflective film or reflective film.

2. Description of the Related Art

Optical information recording media (optical discs) include various types, and the three main types categorized by the writing/reading system are read-only, write-once, and rewritable optical discs. In order to increase storage capacity, single side, multilayer optical discs have also been developed from the ordinary single side, single layer optical discs. For example, in the case of a single side, dual layer optical disc wherein the signals are written and read in the recording layer which is farther from the side of the laser beam incidence, the laser beam should be transmitted through the recording layer which is nearer to the laser beam incidence, reflected by the farther recording layer, and again transmitted through the recording layer which is nearer to the laser beam incidence. Accordingly, a semi-reflective film capable of reflecting and transmitting the laser beam is used for the recording layer which is nearer to the laser beam incidence.

Materials which function as a semi-reflective film include metals such as Ag, Al, Au, Pt, Rh and Cr and elemental semiconductors such as Si and Ge. Among these, pure Ag and Ag alloys containing Ag as their main component are featured in view of (1) high light efficiency (i.e., the total of reflectivity and transmissivity), (2) high reflectivity for the blue-violet laser (wavelength: 405 nm) used in Blu-ray Disc and HD DVD, and (3) high thermal conductivity which enables adequate diffusion of the heat generated in the recording film upon recording of the signals. Such Ag based materials exhibit excellent properties for use as a semi-reflective film of an optical disc including high reflectivity, high transmissivity, low absorptivity, and high thermal conductivity. In this connection, the absorptivity is determined according to the following equation: absorptivity=100%−(reflectivity+transmissivity). However, in order to accomplish sufficient function as a semi-reflective film of an optical disc with long term reliability, the Ag based materials need to overcome the disadvantages of the Ag based materials, namely, (1) cohesion resistance, (2) light resistance and (3) heat resistance.

[1] Cohesion Resistance

Ag based materials are likely undergo cohesion under the effect of heat and/or a halogen such as fluorine, chlorine, bromine or iodine. When it is kept under high temperature, high humidity conditions used in the reliability test of an optical disc, or arranged in contact with a halogen-containing organic material typically of the organic dye recording film, the protective layer or the adhesive layer, cohesion may take place, resulting in the increase in the surface roughness of the thin film or loss of the continuity of the thin film, which may in turn invite loss of the function of the material as a semi-reflective film or a reflective film.

[2] Light Resistance

For example, a single side, dual layer, read-only optical disc has a basic cross sectional structure of polycarbonate (PC) substrate\semi-reflective film\adhesive layer\reflective film\PC substrate. When such an optical disc is irradiated by a Xe lamp (a lamp having a spectrum resembling that of the sunlight) in a so called "light resistance test", the semi-reflective film experiences decrease in the reflectivity when the film comprises a Ag based material, and in such a case, reading of the signal becomes impossible once the reflectivity is reduced to below the threshold value that is required for detecting the signal to be read.

[3] Heat Resistance

A single side, dual layer, write-once optical disc, for example, has a basic cross sectional structure of PC substrate\recording film\semi-reflective film\spacer\recording film\reflective film\PC substrate, and a single side, dual layer, rewritable optical disc has a basic cross sectional structure of PC substrate\dielectric and protective layer\interface layer\recording film\interface layer\dielectric and protective layer\semi-reflective film\intermediate layer\dielectric and protective layer\interface layer\recording film\interface layer\dielectric and protective layer\reflective film\PC substrate. In the case of recordable optical discs including such write-once and rewritable optical discs, the recording layer is heated to a temperature as high as 300° C. to 600° C. during the writing, and a very severe thermal hysteresis is applied to the semi-reflective film or the reflective film. The growth of the crystal grains of the thin film and loss of the continuity of the thin film caused as a result of such thermal hysteresis impair the function of the semi-reflective film and the reflective film.

Various attempts have been made to improve the pure Ag, mainly by alloying the Ag. For example, corrosion resistance is improved in U.S. Pat. No. 6,007,889 by adding Au, Pd, Cu, Rh, Ru, Os, Ir or Pt to Ag; in U.S. Pat. No. 6,280,811, Published Japanese translation of PCT international publication for patent application 2002-518596, by adding Au, Pd, Cu, Rh, Ru, Os, Ir, Be or Pt to Ag; and in U.S. Pat. No. 5,948,497, Japanese Patent Application Laid-Open No. 06-208732 by adding Pd or Cu to Ag. The inventors of the present invention have also disclosed in Japanese Patent No. 3365762 a method for improving crystal structure stability by adding Nd to Ag wherein the crystal structure stabilized by suppressing Ag diffusion and crystal grain growth.

In spite of such efforts, no Ag based alloy has been found that exhibits high reflectivity, high transmissivity, low absorptivity and high thermal conductivity simultaneously with high cohesion resistance, high light resistance and high heat resistance, and accordingly, there is a strong demand for a Ag based alloy which satisfies requirements for all these properties.

SUMMARY OF THE INVENTION

The present invention has been completed in view of such situation, and an object of the present invention is to find a Ag based alloy which exhibits high cohesion resistance, high light resistance, high heat resistance, high reflectivity, high transmissivity, low absorptivity and high thermal conductivity of the level which had not been realized by the pure Ag or by the conventional Ag alloys, and on the bases of such alloy, to provide a semi-reflective film and a reflective film for an optical information recording medium having excellent writing/reading properties and long term reliability; a sputtering target for an optical information recording medium used in depositing the semi-reflective film and the reflective film; and an optical information recording medium including the semi-reflective film or the reflective film.

Specifically, the present invention provides, in a first aspect, a semi-reflective film or reflective film for an optical information recording medium containing a Ag based alloy, wherein the Ag based alloy contains 0.01 to 10 atomic percent of Li.

The Ag based alloy can further contain 0.005 to 0.8 atomic percent of Bi.

In addition or alternatively, the Ag based alloy can further contain 0.1 to 2 atomic percent in total of at least one rare earth metal element selected from the group consisting of Sc, Y, La, Ce, Pr, Nd, Pm, Sm, Eu, Gd, Tb, Dy, Ho, Er, Tm, Yb and Lu.

The rare earth metal element is preferably at least one of Nd and Y.

The Ag based alloy can further contain 0.1 to 3 atomic percent in total of at least one element selected from the group consisting of Cu. Au, Rh, Pd and Pt.

The present invention provides, in a second aspect, an optical information recording medium having the semi-reflective film of the present invention.

Further, the present invention provides, in a third aspect, an optical information recording medium having the reflective film of the present invention.

In a fourth aspect, the present invention provides a Ag based alloy sputtering target, containing Ag and 0.01 to 10 atomic percent of Li.

The Ag based alloy sputtering target can further contain 0.02 to 8 atomic percent of Bi.

The Ag based alloy sputtering target can further contain 0.1 to 2 atomic percent in total of at least one rare earth metal element selected from the group consisting of Sc, Y, La, Ce, Pr, Nd, Pm, Sm, Eu, Gd, Tb, Dy, Ho, Er, Tm, Yb and Lu.

The rare earth metal element in the target is preferably at least one of Nd and Y.

The sputtering target can further contain at least one selected from the group consisting of Cu, Au, Rh, Pd and Pt.

As described above, the semi-reflective film and the reflective film for an optical information recording medium of the present invention have high cohesion resistance, high light resistance, and high heat resistance simultaneously with high reflectivity, high transmissivity, low absorptivity and high thermal conductivity, and the resulting optical information recording medium will exhibit dramatically improved writing/reading properties as well as excellent long term reliability. The sputtering target of the present invention is well adapted for depositing the above-mentioned semi-reflective film or reflective film, and the semi-reflective film and the reflective film produced by using the sputtering target are excellent in the alloy composition, distribution of the alloying element, and uniformity in the film plane direction, and such film will also enjoy low impurity content, and therefore, the resulting semi-reflective film or the reflective film will enjoy high performance, enabling the production of an optical information recording medium having excellent writing/reading properties and excellent long term reliability. Furthermore, the optical information recording medium of the present invention will have remarkably improved writing/reading properties and long term reliability.

DESCRIPTION OF THE PREFERRED EMBODIMENTS

Under the above circumstances, the inventors of the present invention have made intensive investigations to provide a semi-reflective film and a reflective film comprising a Ag based alloy, which are adapted for use in an optical information recording medium, and which exhibit high cohesion resistance, high light resistance and high heat resistance simultaneously with high reflectivity, high transmissivity, low absorptivity and high thermal conductivity. More specifically, the inventors deposited various Ag based alloy thin films of various alloy compositions by sputtering various Ag based alloy sputtering targets, and evaluated these films for their film composition, cohesion resistance, light resistance, heat resistance, reflectivity, transmissivity, absorptivity and thermal conductivity. The inventors then found that the Ag based alloy semi-reflective film and reflective film for an optical information recording medium containing 0.01 to 10 atomic percent of Li have excellent cohesion resistance, light resistance and heat resistance, simultaneously with high reflectivity, high transmissivity, low absorptivity and high thermal conductivity surpassing those of the films made of the pure Ag or the conventional Ag alloys. The present invention has been achieved on the bases of such findings.

The inventors of the present invention have demonstrated that the Ag based alloy thin film containing Li is excellent typically in light resistance as compared with thin films made of pure Ag and the conventional Ag based alloys. For example, decrease in the reflectivity for the light irradiated by a Xe lamp (a lamp having the spectrum resembling the sunlight) takes place, for example, in a single side, dual layer, read only optical disc having the basic cross sectional structure of PC substrate\semi-reflective film\adhesive layer\reflective film\PC substrate only when the semi-reflective film comprises a Ag based material. This is a phenomenon caused by diffusion and penetration of the Ag atom constituting the Ag based semi-reflective film into the adjacent PC substrate and/or adhesive layer. In the Li-containing Ag based alloy thin film of the present invention, ionization of Ag due to light irradiation is prevented by preferential ionization of Li, i.e., sacrificed protection of Li having a higher ionization tendency than Ag. The light resistance is thereby improved. In addition, the inventors revealed that the Li-containing Ag based alloy thin film is an optimal Ag based alloy thin film having not only excellent light resistance, improved cohesion resistance and improved heat resistance, which are disadvantages of conventional Ag based materials, and exhibiting high reflectivity, high transmissivity, low absorptivity and high thermal conductivity, which are advantages of such Ag based materials.

The Ag based alloy semi-reflective film and reflective film for an optical information recording medium of the present invention have a feature that they contain Li in a content of 0.01% to 10% (hereinafter all percentages are atomic percentages, unless otherwise specified). With an increasing content of Li, the improvement of the cohesion resistance, the light resistance and the heat resistance becomes clear but decrease in the reflectivity, the transmissivity and the thermal conductivity as well as increase in the absorptivity occur. Therefore, Li is added in a content of 0.01% to 10%. Li content of less than 0.01% is not preferable since the film will fail to exhibit high cohesion resistance, high light resistance and high heat resistance, whereas Li content exceeding 10% is also not preferable since the resulting film will not exhibit high reflectivity, high transmissivity, low absorptivity and high thermal conductivity. Therefore, the Li content is preferably 0.01% to 10%, more preferably 0.05% to 8%, and further preferably 0.1% to 6%.

Also effective is addition of Bi to the Ag based alloy semi-reflective film and reflective film of the present invention for further higher cohesion resistance, heat resistance and corrosion resistance. However, when Bi is added in a content of less than 0.005%, further improvement in the cohesion resistance, the heat resistance and the corrosion resistance may not be attained. On the other hand, addition of such element exceeding 0.8% may not yield high reflectivity, high transmissivity, low absorptivity and high thermal conductivity. Accordingly, the Bi content, if added, is preferably 0.005% to 0.8%, more preferably 0.01% to 0.6%, and further preferably 0.05% to 0.4%.

Also effective is addition of a total content of 0.1% to 2% of at least one rare earth metal element selected from the group consisting of Sc, Y, La, Ce, Pr, Nd, Pm, Sm, Eu, Gd, Tb, Dy, Ho, Er, Tm, Yb and Lu, and in particular, at least one of Nd and Y to the Ag based alloy semi-reflective film and reflective film of the present invention for further improving the cohesion resistance and the heat resistance. However, when such rare earth element is added in a total content of less than 0.1%, further improvement in the cohesion resistance and the heat resistance is not attained. On the other hand, addition of such element in excess of 2% does not yield high reflectivity, high transmissivity, low absorptivity, and high thermal conductivity. Accordingly, the total content of such elements is preferably 0.1% to 2%, more preferably 0.2% to 1%, and further preferably 0.3% to 0.5%.

Also effective is addition of at least one element selected from Cu, Au, Rh, Pd and Pt to the Ag based alloy semi-reflective film and reflective film of the present invention for further improving the corrosion resistance. However, when the at least one element selected from Cu, Au, Rh, Pd, and Pt is added in a total content of less than 0.1%, further improvement in the corrosion resistance and the heat resistance is not attained. On the other hand, addition of such element in excess of 3% does not yield high reflectivity, high transmissivity, low absorptivity, and high thermal conductivity. Accordingly, such elements are added in a total content of 0.1% to 3%, preferably at 0.2% to 2%, and further preferably at 0.3% to 1%.

It is to be noted that the Ag based alloy semi-reflective film for the optical information recording medium of the present invention is a thin film in a single side, multilayer optical disc which functions to enable transmission and reflection of the laser beam at the recording layer other than the recording layer located farthest from the side of the laser beam incidence, and this film may have a transmissivity of about 45% to 80% and a reflectivity of about 5% to 30%. The thickness may be any adequately determined so that the transmissivity and the reflectivity are within the predetermined range. The Ag based alloy-semi-reflective film, however, may generally have a film thickness in the range of 5 to 25 nm.

It is to be noted that the Ag based alloy reflective film for the optical information recording medium of the present invention is a reflective film of a single side, single layer optical disc, or the reflective film in a single side, multilayer optical disc which is the farthest from the side of the laser beam incidence, and this film may have a reflectivity of about 50% or more and a transmissivity of substantially 0%. The thickness may be any adequately determined so that the reflectivity and the transmissivity are within the predetermined range. The Ag based alloy reflective film, however, may generally have a film thickness in the range of 50 to 250 nm.

The Ag based alloy semi-reflective film and reflective film of the present invention are produced by depositing the above-mentioned Ag based alloy on a substrate by various thin film deposition techniques such as vacuum deposition, ion plating and sputtering, and the recommended is the one produced using the sputtering for the film deposition. Compared to the films formed by other thin film deposition techniques, the Ag based alloy semi-reflective film and reflective film formed by sputtering are superior in the alloy composition, distribution of the alloying elements, and uniformity of the film thickness in the film plane, and hence, in the performance as a semi-reflective film and reflective film (including high reflectivity, high transmissivity, low absorptivity, high thermal conductivity, high cohesion resistance, high light resistance and high heat resistance) enabling the production of an optical information recording medium having excellent writing/reading properties and long term reliability.

In the sputtering, a reflective film of desired alloy composition can be deposited by using a sputtering target (hereinafter simply referred as "target") comprising a Ag based alloy containing 0.01% to 10% of Li. The Li content of the target is 0.01% to 10%, preferably 0.05% to 8%, and more preferably 0.1% to 6%.

To deposit a Ag based alloy semi-reflective film or reflective film further comprising 0.005% to 0.8% of Bi, the target should further contain 0.02% to 8%, preferably 0.1% to 6%, and more preferably 0.2% to 4% of Bi. The Bi content in the target is higher than the Bi content in the semi-reflective film or reflective film since the amount of Bi in the resulting semi-reflective film or reflective film reduces to several to several dozen percent of the Bi that had been present in the target in the course of film deposition by sputtering using the target comprising the Bi-containing Ag based alloy. Such decrease is estimated to have been caused by re-evaporation of the Bi from the film surface in the course of the film deposition due to the substantial difference in the melting point between the Ag and the Bi; difficulty of sputtering Bi due to higher sputtering rate of the Ag compared to that of the Bi; and oxidation of only Bi on the target surface due to higher reactivity of the Bi compared to the Ag. The substantial decrease of the Bi content of the reflective film from that of the target is a phenomenon that is not found in other Ag based alloy such as Ag-rare earth metal alloy. Accordingly, Bi content in the target should be increased compared to that of the Bi in the semi-reflective film or reflective layer to be deposited.

When 0.1% to 2% of at least one rare earth metal element selected from Sc, Y, La, Ce, Pr, Nd, Pm, Sm, Eu, Gd, Tb, Dy, Ho, Er, Tm, Yb and Lu, and in particular, at least one of Nd and Y is to be further added to the semi-reflective film or reflective film, these elements may be added to the target. The rare earth metal element, and in particular, the at least one of Nd and Y may be added in a total content of 0.1% to 2%, preferably 0.2% to 1%, and more preferably 0.3% to 0.5%.

When 0.1% to 3% of at least one element selected from Cu, Au, Rh, Pd and Pt is to be added to the semi-reflective film or reflective film, these elements may be added to the target. The at least one element selected from Cu, Au, Rh, Pd and Pt may be added in a total content of 0.1% to 3%, preferably 0.2% to 2%, and more preferably 0.3% to 1%.

The Ag based alloy sputtering target of the present invention can be produced by any method including melting and casting, powder sintering, and spray forming, and among these, the preferred is the one produced by vacuum melting and casting since the Ag based alloy sputtering target produced by vacuum melting and casting contains less nitrogen, oxygen and other impurities, and the semi-reflective film and the reflective film produced by using such sputtering target efficiently exhibit excellent properties, such as high reflectivity, high transmissivity, low absorptivity, high thermal conductivity, high cohesion resistance, high light resistance and high heat resistance, to enable production of an optical information recording medium having excellent writing/reading properties and long term reliability.

The optical recording medium of the present invention is not particularly limited for its constitution as an optical information recording medium, as long as it has the Ag based alloy semi-reflective film and/or the Ag based alloy reflective film of the present invention, and any constitution known in the field of the optical information recording medium may be employed. For example, the semi-reflective film or the reflective film comprising the Ag based alloy as described above have high reflectivity, high transmissivity, low absorptivity, high thermal conductivity, high cohesion resistance, high light resistance and high heat resistance, and therefore, these films are well adapted for use in the current read-only, write-once, and rewritable optical information recording media as well as next-generation, high storage capacity optical information recording media.

EXAMPLES

The present invention will be described in further detail with reference to the following experimental examples which by no means limit the scope of the present invention. Any modification of such examples without deviating the scope of the present invention is within the technical range of the present invention.

(1) Deposition of Thin Film

By using sputtering targets, sample thin films (Sample Nos. 1 to 139) were each deposited on a polycarbonate substrate (with a diameter of 50 mm and a thickness of 1.0 mm) in a sputtering apparatus HSM-552 manufactured by Shimadzu Corporation by DC magnetron sputtering at a base pressure of $0.27 \times 10^{-3}$ Pa or less, an Ar gas pressure of 0.27 Pa, an Ar gas flow rate of 30 sccm, a sputtering power of DC 200 W, a distance between the target and substrate of 52 mm and a substrate temperature of room temperature. The sputtering targets used herein are a pure Ag sputtering target (with a diameter of 101.6 mm and a thickness of 5 mm), a Ag—Li alloy sputtering target (with a diameter of 101.6 mm and a thickness of 5 mm), a Ag—Li—Bi alloy sputtering target (with a diameter of 101.6 mm and a thickness of 5 mm), a composited sputtering target (with a diameter of 101.6 mm and a thickness of 5 mm) comprising the Ag—Li alloy sputtering target or the Ag—Li—Bi sputtering target and a predetermined number of the chips (with a width of 5 mm, a length of 5 mm and a thickness of 1 mm) of an alloying element (Nd, Y, Cu or Au) arranged on the Ag—Li alloy sputtering target or the Ag—Li—Bi sputtering target, or a Ag alloy sputtering target (with a diameter of 101.6 mm and a thickness of 5 mm). The sample thin films for the analysis of the film composition, and the evaluation of cohesion resistance (cohesion caused by heat, and cohesion caused by a halogen), heat resistance and thermal conductivity had a thickness of 100 nm, corresponding to the thickness of a reflective film used in an optical information recording medium. The sample films for the evaluation of the light resistance, reflectivity, transmissivity and absorptivity had a thickness of 15 nm, corresponding to the thickness of a semi-reflective film used in an optical information recording medium.

(2) Analysis of the Film Composition

Of the thus deposited thin films, Ag alloy thin films (Sample Nos. 2 to 139) were analyzed for their film composition by inductively coupled plasma (ICP) mass spectroscopy. More specifically, analysis was conducted by dissolving an analyte Ag alloy thin film in an acid solution (nitric acid:pure water=1:1), heating the acid solution on a hot plate of 200° C., cooling the solution to room temperature after confirming that all analyte sample had dissolved in the acid solution, and measuring the amount of alloying element in the Ag alloy thin film by using ICP mass spectrometer SPQ-8000 manufactured by Seiko Instrument Inc. The analyzed film compositions of the samples are shown in Table 1 together with the results of the film structure analysis and evaluation of various properties in Tables 2 to 7 as described below.

Table 1

(3) Evaluation of Light Resistance

Samples wherein the thus deposited thin films (Sample Nos. 1 to 139) was overlaid with a UV curable resin film were subjected to determination of their spectral reflectivity and spectral transmissivity at wavelengths of 400 to 800 nm using by using UV-Vis-NIR spectrophotometer V-570DS manufactured by JASCO. The samples were then subjected to UV/visible light irradiation test using Super Xenon Fading Apparatus SX75F manufactured by Suga Test Instruments Co., Ltd., wherein the samples were irradiated with UV/visible light at an illuminance of 120 W/m$^2$, a temperature of 80° C. for 144 hours by a xenon arc lamp, and the spectral reflectivity and spectral transmissivity were determined after the test. The results of the evaluation for the light resistance are shown in Table 2.

Table 2

In Table 2, a sample with a change in reflectivity to laser beam with a wavelength of 405 nm typically used in Blu-ray Disc and HD DVD between before and after the irradiation test of less than 1% was regarded to have high light resistance and evaluated as "A", and a sample with the change of 1% or more was regarded to have low light resistance and evaluated as "B".

Table 2 shows that the Ag thin film (Sample No. 1), the Ag—Au thin film (Sample No. 2), the Ag—Pd thin film (Sample No. 3) and the Ag—Pt thin film (Sample No. 4) fail to exhibit high light resistance.

In contrast, the thin films of Sample Nos. 5 to 139 exhibit high light resistance due to incorporation of Li. The effects of adding Rh, Pd and Pt are equivalent to the addition of Cu and Au.

(4) Evaluation of Cohesion Resistance (Cohesion Caused by Heat)

The thus deposited thin films (Sample Nos. 1 to 139) were measured for average surface roughness Ra by using Nanoscope IIIa scanning probe microscope manufactured by Digital Instruments in an atomic force microscope (AEM) observation mode. These thin films were subjected to high temperature, high humidity test at a temperature of 80° C. and relative humidity of 90% RH for 48 hours, and the average surface roughness Ra was measured again after this test. The results of the evaluation for the cohesion resistance (cohesion caused by heat) are shown in Table 3.

Table 3

In Table 3, a sample with a change in average surface roughness between before and after the high temperature, high humidity test of less than 1.5 nm was regarded to have high cohesion resistance, and was evaluated as "A", and a sample with a change in average surface roughness of 1.5 nm or more was regarded to have no such high cohesion resistance and was evaluated as "B".

As demonstrated in Table 3, all Ag alloy thin films containing Li (Sample Nos. 5 to 139) exhibit high cohesion resistance, and those not containing Li, namely, the Ag thin film (Sample No. 1), the Ag—Au thin film (Sample No. 2), the Ag—Pd thin film (Sample No. 3) and the Ag—Pt thin film (Sample No. 4) fail to show such high cohesion resistance. The effects of adding Rh, Pd, and Pt are equivalent to the addition of the Cu and Au.

(5) Evaluation of Cohesion Resistance (Cohesion Caused by a Halogen)

The thus deposited thin films (Sample Nos. 1 to 139) were measured for average surface roughness Ra by using Nanoscope IIIa scanning probe microscope manufactured by Digital Instruments in an atomic force microscope (AEM) observation mode. These thin films were subjected to saltwater immersion test at a salt water concentration (NaCl concentration) of 0.05 mol/l, a salt water temperature of 20° C., and an immersion time of 5 minutes, and the average surface roughness Ra was measured again after this test. The results of the evaluation for the cohesion resistance (cohesion caused by a halogen) are shown in Table 4.

Table 4

In Table 4, a sample with a change in average surface roughness between before and after the salt water immersion test of less than 3 nm was regarded to have a high cohesion resistance and was evaluated as "A", and a sample with a change in average surface roughness of 3 nm or more was regarded to have no such high cohesion resistance and was evaluated as "B".

As demonstrated in Table 4, the Ag—Au thin film (Sample No. 2), the Ag—Pd thin film (Sample No. 3), the Ag—Pt thin film (Sample No. 4), and the Ag alloy thin films containing Li (Sample Nos. 5 to 139) exhibit high cohesion resistance, and the Ag thin film (Sample No. 1) fails to show the high cohesion resistance. The effects of adding Rh, Pd, and Pt are equivalent to the addition of the Cu and Au.

(6) Evaluation of Heat Resistance

The thus deposited thin films (Sample Nos. 1 to 139) were measured for average surface roughness Ra by using Nanoscope IIIa scanning probe microscope manufactured by Digital Instruments in an atomic force microscope (AFM) observation mode. These thin films were subjected to vacuum heating test at a degree of vacuum of $0.27\times10^{-3}$ Pa or less and a temperature of 300° C. for 0.5 hour using a heat treatment apparatus in rotary magnetic field manufactured by Naruse Scientific Machines, and the average surface roughness Ra was measured again after this test. The results of the evaluation for the heat resistance are shown in Table 5.

Table 5

In Table 5, a sample with a change in average surface roughness between before and after the vacuum heating test of less than 1.5 nm was regarded to have an excellent heat resistance and was evaluated "A", a sample with a change in average surface roughness of 1.5 nm or more and less than 3.0 nm was regarded to have a high heat resistance and was evaluated as "B", and a sample with a change in average surface roughness of 3.0 nm or more was regarded as the one not having such high heat resistance and was evaluated as "C".

The Ag thin film (Sample No. 1), the Ag—Au thin film (Sample No. 2), the Ag—Pd thin film (Sample No. 3) and the Ag—Pt thin film (Sample No. 4) fail to exhibit high heat resistance.

In contrast, the thin films of Sample Nos. 5 to 139 exhibit high heat resistance. Among them, the thin films containing at least one of Nd and Y show further high heat resistance. The effects of adding Rh, Pd, and Pt are equivalent to the addition of Cu and Au.

(7) Evaluation of Reflectivity, Transmissivity and Absorptivity

The thus deposited thin films (Sample Nos. 1 to 139) were measured for spectral reflectivity and spectral transmissivity at wavelengths of 400 to 800 nm by using UV-Vis-NIR spectrophotometer V-570DS manufactured by JASCO, and absorptivity was calculated from the measured reflectivity and the transmissivity according to the following equation:

Absorptivity=100%−(Reflectivity+Transmissivity)

The results of the evaluation for the reflectivity, the transmissivity, and the absorptivity for the laser beam with the wavelength of 405 nm typically used in Blu-ray Disc and HD DVD are shown in Table 6.

Table 6

In Table 6, the sample having a reflectivity of 15% or more, a transmissivity of 60% or more, and an absorptivity of less than 25,% in relation to the reflectivity of 18%, the transmissivity of 68%, and the absorptivity of 14% of the pure Ag was regarded as the one having excellent optical properties, and such sample was evaluated "A", and the sample having a reflectivity of less than 15%, a transmissivity of less than 60%, and an absorptivity 0.25% or more was regarded as the one not having the excellent optical properties, and such sample was regarded as "B".

The Ag-16% Li thin film (Sample No. 8) fails to show high reflectivity, high transmissivity and low absorptivity due to its excessively high Li content.

In contrast, the other sample thin films exhibit high reflectivity, high transmissivity and low absorptivity. The effects of adding Rh, Pd and Pt are equivalent to the addition of the Cu and Au.

(8) Evaluation of Thermal Conductivity

The thus deposited thin films (Sample Nos. 1 to 139) were measured for thermal conductivity by the procedure as described below. Namely, thermal conductivity was determined by measuring the sheet resistance Rs by DC four-probe technique using 3226 mΩHi TESTER manufactured by HIOKI E. E. CORPORATION; measuring the film thickness t using alpha-step 250 manufactured by TENCOR INSTRUMENTS; calculating the electrical resistivity $\rho$ ($\mu\Omega$cm) according to the following equation: $\rho$=sheet resistance Rs×film thickness t; and then, calculating the thermal conductivity $\kappa$(W/(m·K)) at an absolute temperature of 300K (ca. 27° C.) by Wiedemann-Franz law according to the following equation: $\kappa$=2.51×(absolute temperature T)/(electrical resistivity $\rho$). The results of the evaluation for the thermal conductivity are shown in Table 7.

Table 7

In Table 7, a sample having a thermal conductivity of 160 W/(m·K) or more corresponding 50% or more of 320W/(m·K), the thermal conductivity of the pure Ag thin film, was regarded to have excellent thermal conductivity and was evaluated "A", and a sample having a thermal conductivity of less than 160 W/(m·K) was regarded as the one not having the excellent thermal conductivity and was regarded as "B".

The Ag-16% Li thin film (Sample No. 8) fails to show high thermal conductivity due to its excessively high Li content.

In contrast, the other sample thin films exhibit high thermal conductivity. The effects of adding Rh, Pd, and Pt are equivalent to the addition of the Cu and Au.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

TABLE 1

| Sample No. | Film Composition |
|---|---|
| 1 | Ag |
| 2 | Ag—3% Au |
| 3 | Ag—3% Pd |
| 4 | Ag—3% Pt |
| 5 | Ag—0.01% Li |
| 6 | Ag—4% Li |
| 7 | Ag—10% Li |
| 8 | Ag—16% Li |
| 9 | Ag—4% Li—0.1% Bi |
| 10 | Ag—4% Li—0.4% Nd |
| 11 | Ag—4% Li—0.4% Y |
| 12 | Ag—4% Li—0.5% Cu |
| 13 | Ag—4% Li—0.5% Au |
| 14 | Ag—4% Li—0.1% Bi—0.4% Nd |
| 15 | Ag—4% Li—0.1% Bi—0.4% Y |
| 16 | Ag—4% Li—0.1% Bi—0.5% Cu |
| 17 | Ag—4% Li—0.1% Bi—0.5% Au |
| 18 | Ag—4% Li—0.4% Nd—0.5% Cu |
| 19 | Ag—4% Li—0.4% Nd—0.5% Au |
| 20 | Ag—4% Li—0.4% Y—0.5% Cu |
| 21 | Ag—4% Li—0.4% Y—0.5% Au |
| 22 | Ag—4% Li—0.1% Bi—0.4% Nd—0.5% Cu |
| 23 | Ag—4% Li—0.1% Bi—0.4% Nd—0.5% Au |
| 24 | Ag—4% Li—0.1% Bi—0.4% Y—0.5% Cu |
| 25 | Ag—4% Li—0.1% Bi—0.4% Y—0.5% Au |
| 26 | Ag—0.05% Li |
| 27 | Ag—0.1% Li |
| 28 | Ag—0.5% Li |
| 29 | Ag—1% Li |
| 30 | Ag—2% Li |
| 31 | Ag—0.1% Li—0.005% Bi |
| 32 | Ag—0.1% Li—0.01% Bi |
| 33 | Ag—0.1% Li—0.05% Bi |
| 34 | Ag—0.1% Li—0.1% Bi |
| 35 | Ag—0.1% Li—0.2% Bi |
| 36 | Ag—0.5% Li—0.005% Bi |
| 37 | Ag—0.5% Li—0.01% Bi |
| 38 | Ag—0.5% Li—0.05% Bi |
| 39 | Ag—0.5% Li—0.1% Bi |
| 40 | Ag—0.5% Li—0.2% Bi |
| 41 | Ag—1% Li—0.005% Bi |
| 42 | Ag—1% Li—0.01% Bi |
| 43 | Ag—1% Li—0.05% Bi |
| 44 | Ag—1% Li—0.1% Bi |
| 45 | Ag—1% Li—0.2% Bi |
| 46 | Ag—2% Li—0.005% Bi |

TABLE 1-continued

| Sample No. | Film Composition |
|---|---|
| 47 | Ag—2% Li—0.01% Bi |
| 48 | Ag—2% Li—0.05% Bi |
| 49 | Ag—2% Li—0.1% Bi |
| 50 | Ag—2% Li—0.2% Bi |
| 51 | Ag—0.1% Li—0.1% Nd |
| 52 | Ag—0.1% Li—0.2% Nd |
| 53 | Ag—0.1% Li—0.5% Nd |
| 54 | Ag—0.1% Li—1% Nd |
| 55 | Ag—0.1% Li—2% Nd |
| 56 | Ag—0.5% Li—0.1% Nd |
| 57 | Ag—0.5% Li—0.2% Nd |
| 58 | Ag—0.5% Li—0.5% Nd |
| 59 | Ag—0.5% Li—1% Nd |
| 60 | Ag—0.5% Li—2% Nd |
| 61 | Ag—1% Li—0.1% Nd |
| 62 | Ag—1% Li—0.2% Nd |
| 63 | Ag—1% Li—0.5% Nd |
| 64 | Ag—1% Li—1% Nd |
| 65 | Ag—1% Li—2% Nd |
| 66 | Ag—2% Li—0.1% Nd |
| 67 | Ag—2% Li—0.2% Nd |
| 68 | Ag—2% Li—0.5% Nd |
| 69 | Ag—2% Li—1% Nd |
| 70 | Ag—2% Li—2% Nd |
| 71 | Ag—0.1% Li—0.1% Cu |
| 72 | Ag—0.1% Li—0.2% Cu |
| 73 | Ag—0.1% Li—0.5% Cu |
| 74 | Ag—0.1% Li—1% Cu |
| 75 | Ag—0.1% Li—2% Cu |
| 76 | Ag—0.1% Li—3% Cu |
| 77 | Ag—0.5% Li—0.1% Cu |
| 78 | Ag—0.5% Li—0.2% Cu |
| 79 | Ag—0.5% Li—0.5% Cu |
| 80 | Ag—0.5% Li—1% Cu |
| 81 | Ag—0.5% Li—2% Cu |
| 82 | Ag—0.5% Li—3% Cu |
| 83 | Ag—1% Li—0.1% Cu |
| 84 | Ag—1% Li—0.2% Cu |
| 85 | Ag—1% Li—0.5% Cu |
| 86 | Ag—1% Li—1% Cu |
| 87 | Ag—1% Li—2% Cu |
| 88 | Ag—1% Li—3% Cu |
| 89 | Ag—2% Li—0.1% Cu |
| 90 | Ag—2% Li—0.2% Cu |
| 91 | Ag—2% Li—0.5% Cu |
| 92 | Ag—2% Li—1% Cu |
| 93 | Ag—2% Li—2% Cu |
| 94 | Ag—2% Li—3% Cu |
| 95 | Ag—0.1% Li—0.1% Au |
| 96 | Ag—0.1% Li—0.2% Au |
| 97 | Ag—0.1% Li—0.5% Au |
| 98 | Ag—0.1% Li—1% Au |
| 99 | Ag—0.1% Li—2% Au |
| 100 | Ag—0.1% Li—3% Au |
| 101 | Ag—0.5% Li—0.1% Au |
| 102 | Ag—0.5% Li—0.2% Au |
| 103 | Ag—0.5% Li—0.5% Au |
| 104 | Ag—0.5% Li—1% Au |
| 105 | Ag—0.5% Li—2% Au |
| 106 | Ag—0.5% Li—3% Au |
| 107 | Ag—1% Li—0.1% Au |
| 108 | Ag—1% Li—0.2% Au |
| 109 | Ag—1% Li—0.5% Au |
| 110 | Ag—1% Li—1% Au |
| 111 | Ag—1% Li—2% Au |
| 112 | Ag—1% Li—3% Au |
| 113 | Ag—2% Li—0.1% Au |
| 114 | Ag—2% Li—0.2% Au |
| 115 | Ag—2% Li—0.5% Au |
| 116 | Ag—2% Li—1% Au |
| 117 | Ag—2% Li—2% Au |
| 118 | Ag—2% Li—3% Au |
| 119 | Ag—1% Li—0.2% Bi—0.5% Nd |
| 120 | Ag—2% Li—0.2% Bi—0.5% Nd |
| 121 | Ag—4% Li—0.2% Bi—0.5% Nd |
| 122 | Ag—1% Li—0.2% Bi—2% Cu |

TABLE 1-continued

| Sample No. | Film Composition |
|---|---|
| 123 | Ag—2% Li—0.2% Bi—2% Cu |
| 124 | Ag—4% Li—0.2% Bi—2% Cu |
| 125 | Ag—1% Li—0.2% Bi—2% Au |
| 126 | Ag—2% Li—0.2% Bi—2% Au |
| 127 | Ag—4% Li—0.2% Bi—2% Au |
| 128 | Ag—1% Li—0.5% Nd—2% Cu |
| 129 | Ag—1% Li—0.5% Nd—2% Au |
| 130 | Ag—2% Li—0.5% Nd—2% Cu |
| 131 | Ag—2% Li—0.5% Nd—2% Au |
| 132 | Ag—4% Li—0.5% Nd—2% Cu |
| 133 | Ag—4% Li—0.5% Nd—2% Au |
| 134 | Ag—1% Li—0.2% Bi—0.5% Nd—2% Cu |
| 135 | Ag—1% Li—0.2% Bi—0.5% Nd—2% Au |
| 136 | Ag—1% Li—0.2% Bi—0.5% Nd—1% Cu—1% Au |
| 137 | Ag—2% Li—0.2% Bi—0.5% Nd—2% Cu |
| 138 | Ag—2% Li—0.2% Bi—0.5% Nd—2% Au |
| 139 | Ag—2% Li—0.2% Bi—0.5% Nd—1% Cu—1% Au |

TABLE 2

| Sample No. | Film Composition | Change in reflectivity (%) | Light resistance |
|---|---|---|---|
| 1 | Ag | −3.1 | B |
| 2 | Ag—3% Au | −2.9 | B |
| 3 | Ag—3% Pd | −2.8 | B |
| 4 | Ag—3% Pt | −3.0 | B |
| 5 | Ag—0.01% Li | −0.8 | A |
| 6 | Ag—4% Li | −0.5 | A |
| 7 | Ag—10% Li | −0.3 | A |
| 8 | Ag—16% Li | −0.2 | A |
| 9 | Ag—4% Li—0.1% Bi | −0.4 | A |
| 10 | Ag—4% Li—0.4% Nd | −0.5 | A |
| 11 | Ag—4% Li—0.4% Y | −0.5 | A |
| 12 | Ag—4% Li—0.5% Cu | −0.5 | A |
| 13 | Ag—4% Li—0.5% Au | −0.5 | A |
| 14 | Ag—4% Li—0.1% Bi—0.4% Nd | −0.4 | A |
| 15 | Ag—4% Li—0.1% Bi—0.4% Y | −0.4 | A |
| 16 | Ag—4% Li—0.1% Bi—0.5% Cu | −0.4 | A |
| 17 | Ag—4% Li—0.1% Bi—0.5% Au | −0.4 | A |
| 18 | Ag—4% Li—0.4% Nd—0.5% Cu | −0.5 | A |
| 19 | Ag—4% Li—0.4% Nd—0.5% Au | −0.5 | A |
| 20 | Ag—4% Li—0.4% Y—0.5% Cu | −0.5 | A |
| 21 | Ag—4% Li—0.4% Y—0.5% Au | −0.5 | A |
| 22 | Ag—4% Li—0.1% Bi—0.4% Nd—0.5% Cu | −0.4 | A |
| 23 | Ag—4% Li—0.1% Bi—0.4% Nd—0.5% Au | −0.4 | A |
| 24 | Ag—4% Li—0.1% Bi—0.4% Y—0.5% Cu | −0.4 | A |
| 25 | Ag—4% Li—0.1% Bi—0.4% Y—0.5% Au | −0.4 | A |
| 26 | Ag—0.05% Li | −0.8 | A |
| 27 | Ag—0.1% Li | −0.8 | A |
| 28 | Ag—0.5% Li | −0.7 | A |
| 29 | Ag—1% Li | −0.7 | A |
| 30 | Ag—2% Li | −0.6 | A |
| 31 | Ag—0.1% Li—0.005% Bi | −0.6 | A |
| 32 | Ag—0.1% Li—0.01% Bi | −0.5 | A |
| 33 | Ag—0.1% Li—0.05% Bi | −0.5 | A |
| 34 | Ag—0.1% Li—0.1% Bi | −0.4 | A |
| 35 | Ag—0.1% Li—0.2% Bi | −0.4 | A |
| 36 | Ag—0.5% Li—0.005% Bi | −0.5 | A |
| 37 | Ag—0.5% Li—0.01% Bi | −0.4 | A |
| 38 | Ag—0.5% Li—0.05% Bi | −0.4 | A |
| 39 | Ag—0.5% Li—0.1% Bi | −0.3 | A |
| 40 | Ag—0.50% Li—0.2% Bi | −0.3 | A |
| 41 | Ag—1% Li—0.005% Bi | −0.5 | A |
| 42 | Ag—1% Li—0.01% Bi | −0.4 | A |
| 43 | Ag—1% Li—0.05% Bi | −0.4 | A |
| 44 | Ag—1% Li—0.1% Bi | −0.3 | A |
| 45 | Ag—1% Li—0.2% Bi | −0.3 | A |
| 46 | Ag—2% Li—0.005% Bi | −0.4 | A |
| 47 | Ag—2% Li—0.01% Bi | −0.3 | A |
| 48 | Ag—2% Li—0.05% Bi | −0.3 | A |
| 49 | Ag—2% Li—0.1% Bi | −0.2 | A |
| 50 | Ag—2% Li—0.2% Bi | −0.2 | A |
| 51 | Ag—0.1% Li—0.1% Nd | −0.8 | A |
| 52 | Ag—0.1% Li—0.2% Nd | −0.8 | A |
| 53 | Ag—0.1% Li—0.5% Nd | −0.8 | A |
| 54 | Ag—0.1% Li—1% Nd | −0.8 | A |
| 55 | Ag—0.1% Li—2% Nd | −0.8 | A |
| 56 | Ag—0.5% Li—0.1% Nd | −0.7 | A |
| 57 | Ag—0.5% Li—0.2% Nd | −0.7 | A |
| 58 | Ag—0.5% Li—0.5% Nd | −0.7 | A |
| 59 | Ag—0.5% Li—1% Nd | −0.7 | A |
| 60 | Ag—0.5% Li—2% Nd | −0.7 | A |
| 61 | Ag—1% Li—0.1% Nd | −0.7 | A |
| 62 | Ag—1% Li—0.2% Nd | −0.7 | A |
| 63 | Ag—1% Li—0.5% Nd | −0.7 | A |
| 64 | Ag—1% Li—1% Nd | −0.7 | A |
| 65 | Ag—1% Li—2% Nd | −0.7 | A |
| 66 | Ag—2% Li—0.1% Nd | −0.6 | A |
| 67 | Ag—2% Li—0.2% Nd | −0.6 | A |
| 68 | Ag—2% Li—0.5% Nd | −0.6 | A |
| 69 | Ag—2% Li—1% Nd | −0.6 | A |
| 70 | Ag—2% Li—2% Nd | −0.6 | A |
| 71 | Ag—0.1% Li—0.1% Cu | −0.8 | A |
| 72 | Ag—0.1% Li—0.2% Cu | −0.8 | A |
| 73 | Ag—0.1% Li—0.5% Cu | −0.8 | A |
| 74 | Ag—0.1% Li—1% Cu | −0.8 | A |
| 75 | Ag—0.1% Li—2% Cu | −0.8 | A |
| 76 | Ag—0.1% Li—3% Cu | −0.8 | A |
| 77 | Ag—0.5% Li—0.1% Cu | −0.7 | A |
| 78 | Ag—0.5% Li—0.2% Cu | −0.7 | A |
| 79 | Ag—0.5% Li—0.5% Cu | −0.7 | A |
| 80 | Ag—0.5% Li—1% Cu | −0.7 | A |
| 81 | Ag—0.5% Li—2% Cu | −0.7 | A |
| 82 | Ag—0.5% Li—3% Cu | −0.7 | A |
| 83 | Ag—1% Li—0.1% Cu | −0.7 | A |
| 84 | Ag—1% Li—0.2% Cu | −0.7 | A |
| 85 | Ag—1% Li—0.5% Cu | −0.7 | A |
| 86 | Ag—1% Li—1% Cu | −0.7 | A |
| 87 | Ag—1% Li—2% Cu | −0.7 | A |
| 88 | Ag—1% Li—3% Cu | −0.7 | A |
| 89 | Ag—2% Li—0.1% Cu | −0.6 | A |
| 90 | Ag—2% Li—0.2% Cu | −0.6 | A |
| 91 | Ag—2% Li—0.5% Cu | −0.6 | A |
| 92 | Ag—2% Li—1% Cu | −0.6 | A |
| 93 | Ag—2% Li—2% Cu | −0.6 | A |
| 94 | Ag—2% Li—3% Cu | −0.6 | A |
| 95 | Ag—0.1% Li—0.1% Au | −0.8 | A |
| 96 | Ag—0.1% Li—0.2% Au | −0.8 | A |
| 97 | Ag—0.1% Li—0.5% Au | −0.8 | A |
| 98 | Ag—0.1% Li—1% Au | −0.8 | A |
| 99 | Ag—0.1% Li—2% Au | −0.8 | A |
| 100 | Ag—0.1% Li—3% Au | −0.8 | A |
| 101 | Ag—0.5% Li—0.1% Au | −0.7 | A |
| 102 | Ag—0.5% Li—0.2% Au | −0.7 | A |
| 103 | Ag—0.5% Li—0.5% Au | −0.7 | A |
| 104 | Ag—0.5% Li—1% Au | −0.7 | A |
| 105 | Ag—0.5% Li—2% Au | −0.7 | A |
| 106 | Ag—0.5% Li—3% Au | −0.7 | A |
| 107 | Ag—1% Li—0.1% Au | −0.7 | A |
| 108 | Ag—1% Li—0.2% Au | −0.7 | A |
| 109 | Ag—1% Li—0.5% Au | −0.7 | A |
| 110 | Ag—1% Li—1% Au | −0.7 | A |
| 111 | Ag—1% Li—2% Au | −0.7 | A |
| 112 | Ag—1% Li—3% Au | −0.7 | A |
| 113 | Ag—2% Li—0.1% Au | −0.6 | A |
| 114 | Ag—2% Li—0.2% Au | −0.6 | A |
| 115 | Ag—2% Li—0.5% Au | −0.6 | A |
| 116 | Ag—2% Li—1% Au | −0.6 | A |
| 117 | Ag—2% Li—2% Au | −0.6 | A |
| 118 | Ag—2% Li—3% Au | −0.6 | A |
| 119 | Ag—1% Li—0.2% Bi—0.5% Nd | −0.3 | A |
| 120 | Ag—2% Li—0.2% Bi—0.5% Nd | −0.2 | A |

TABLE 2-continued

| Sample No. | Film Composition | Change in reflectivity (%) | Light resistance |
|---|---|---|---|
| 121 | Ag—4% Li—0.2% Bi—0.5% Nd | −0.1 | A |
| 122 | Ag—1% Li—0.2% Bi—2% Cu | −0.3 | A |
| 123 | Ag—2% Li—0.2% Bi—2% Cu | −0.2 | A |
| 124 | Ag—4% Li—0.2% Bi—2% Cu | −0.1 | A |
| 125 | Ag—1% Li—0.2% Bi—2% Au | −0.3 | A |
| 126 | Ag—2% Li—0.2% Bi—2% Au | −0.2 | A |
| 127 | Ag—4% Li—0.2% Bi—2% Au | −0.1 | A |
| 128 | Ag—1% Li—0.5% Nd—2% Cu | −0.7 | A |
| 129 | Ag—1% Li—0.5% Nd—2% Au | −0.7 | A |
| 130 | Ag—2% Li—0.5% Nd—2% Cu | −0.6 | A |
| 131 | Ag—2% Li—0.5% Nd—2% Au | −0.6 | A |
| 132 | Ag—4% Li—0.5% Nd—2% Cu | −0.5 | A |
| 133 | Ag—4% Li—0.5% Nd—2% Au | −0.5 | A |
| 134 | Ag—1% Li—0.2% Bi—0.5% Nd—2% Cu | −0.3 | A |
| 135 | Ag—1% Li—0.2% Bi—0.5% Nd—2% Au | −0.3 | A |
| 136 | Ag—1% Li—0.2% Bi—0.5% Nd—1% Cu—1% Au | −0.3 | A |
| 137 | Ag—2% Li—0.2% Bi—0.5% Nd—2% Cu | −0.2 | A |
| 138 | Ag—2% Li—0.2% Bi—0.5% Nd—2% Au | −0.2 | A |
| 139 | Ag—2% Li—0.2% Bi—0.5% Nd—1% Cu—1% Au | −0.2 | A |

TABLE 3

| Sample No. | Film Composition | Change in average surface roughness (nm) | Cohesion resistance (cohesion caused by heat) |
|---|---|---|---|
| 1 | Ag | 3.0 | B |
| 2 | Ag—3% Au | 2.0 | B |
| 3 | Ag—3% Pd | 1.8 | B |
| 4 | Ag—3% Pt | 2.2 | B |
| 5 | Ag—0.01% Li | 0.7 | A |
| 6 | Ag—4% Li | 0.6 | A |
| 7 | Ag—10% Li | 0.4 | A |
| 8 | Ag—16% Li | 0.4 | A |
| 9 | Ag—4% Li—0.1% Bi | 0.4 | A |
| 10 | Ag—4% Li—0.4% Nd | 0.4 | A |
| 11 | Ag—4% Li—0.4% Y | 0.4 | A |
| 12 | Ag—4% Li—0.5% Cu | 0.6 | A |
| 13 | Ag—4% Li—0.5% Au | 0.6 | A |
| 14 | Ag—4% Li—0.1% Bi—0.4% Nd | 0.3 | A |
| 15 | Ag—4% Li—0.1% Bi—0.4% Y | 0.3 | A |
| 16 | Ag—4% Li—0.1% Bi—0.5% Cu | 0.4 | A |
| 17 | Ag—4% Li—0.1% Bi—0.5% Au | 0.4 | A |
| 18 | Ag—4% Li—0.4% Nd—0.5% Cu | 0.4 | A |
| 19 | Ag—4% Li—0.4% Nd—0.5% Au | 0.4 | A |
| 20 | Ag—4% Li—0.4% Y—0.5% Cu | 0.4 | A |
| 21 | Ag—4% Li—0.4% Y—0.5% Au | 0.4 | A |
| 22 | Ag—4% Li—0.1% Bi—0.4% Nd—0.5% Cu | 0.3 | A |
| 23 | Ag—4% Li—0.1% Bi—0.4% Nd—0.5% Au | 0.3 | A |
| 24 | Ag—4% Li—0.1% Bi—0.4% Y—0.5% Cu | 0.3 | A |
| 25 | Ag—4% Li—0.1% Bi—0.4% Y—0.5% Au | 0.3 | A |
| 26 | Ag—0.05% Li | 0.7 | A |
| 27 | Ag—0.1% Li | 0.7 | A |
| 28 | Ag—0.5% Li | 0.7 | A |
| 29 | Ag—1% Li | 0.6 | A |
| 30 | Ag—2% Li | 0.6 | A |
| 31 | Ag—0.1% Li—0.005% Bi | 0.6 | A |
| 32 | Ag—0.1% Li—0.01% Bi | 0.6 | A |
| 33 | Ag—0.1% Li—0.05% Bi | 0.6 | A |
| 34 | Ag—0.1% Li—0.1% Bi | 0.5 | A |
| 35 | Ag—0.1% Li—0.2% Bi | 0.5 | A |
| 36 | Ag—0.5% Li—0.005% Bi | 0.6 | A |
| 37 | Ag—0.5% Li—0.01% Bi | 0.6 | A |
| 38 | Ag—0.5% Li—0.05% Bi | 0.6 | A |
| 39 | Ag—0.5% Li—0.1% Bi | 0.5 | A |
| 40 | Ag—0.5% Li—0.2% Bi | 0.5 | A |
| 41 | Ag—1% Li—0.005% Bi | 0.5 | A |
| 42 | Ag—1% Li—0.01% Bi | 0.5 | A |
| 43 | Ag—1% Li—0.05% Bi | 0.5 | A |
| 44 | Ag—1% Li—0.1% Bi | 0.4 | A |
| 45 | Ag—1% Li—0.2% Bi | 0.4 | A |
| 46 | Ag—2% Li—0.005% Bi | 0.5 | A |
| 47 | Ag—2% Li—0.01% Bi | 0.5 | A |
| 48 | Ag—2% Li—0.05% Bi | 0.5 | A |
| 49 | Ag—2% Li—0.1% Bi | 0.4 | A |
| 50 | Ag—2% Li—0.2% Bi | 0.4 | A |
| 51 | Ag—0.1% Li—0.1% Nd | 0.6 | A |
| 52 | Ag—0.1% Li—0.2% Nd | 0.5 | A |
| 53 | Ag—0.1% Li—0.5% Nd | 0.5 | A |
| 54 | Ag—0.1% Li—1% Nd | 0.3 | A |
| 55 | Ag—0.1% Li—2% Nd | 0.3 | A |
| 56 | Ag—0.5% Li—0.1% Nd | 0.6 | A |
| 57 | Ag—0.5% Li—0.2% Nd | 0.5 | A |
| 58 | Ag—0.5% Li—0.5% Nd | 0.5 | A |
| 59 | Ag—0.5% Li—1% Nd | 0.3 | A |
| 60 | Ag—0.5% Li—2% Nd | 0.3 | A |
| 61 | Ag—1% Li—0.1% Nd | 0.5 | A |
| 62 | Ag—1% Li—0.2% Nd | 0.4 | A |
| 63 | Ag—1% Li—0.5% Nd | 0.4 | A |
| 64 | Ag—1% Li—1% Nd | 0.2 | A |
| 65 | Ag—1% Li—2% Nd | 0.2 | A |
| 66 | Ag—2% Li—0.1% Nd | 0.5 | A |
| 67 | Ag—2% Li—0.2% Nd | 0.4 | A |
| 68 | Ag—2% Li—0.5% Nd | 0.4 | A |
| 69 | Ag—2% Li—1% Nd | 0.2 | A |
| 70 | Ag—2% Li—2% Nd | 0.2 | A |
| 71 | Ag—0.1% Li—0.1% Cu | 0.7 | A |
| 72 | Ag—0.1% Li—0.2% Cu | 0.7 | A |
| 73 | Ag—0.1% Li—0.5% Cu | 0.7 | A |
| 74 | Ag—0.1% Li—1% Cu | 0.7 | A |
| 75 | Ag—0.1% Li—2% Cu | 0.7 | A |
| 76 | Ag—0.1% Li—3% Cu | 0.7 | A |
| 77 | Ag—0.5% Li—0.1% Cu | 0.7 | A |
| 78 | Ag—0.5% Li—0.2% Cu | 0.7 | A |
| 79 | Ag—0.5% Li—0.5% Cu | 0.7 | A |
| 80 | Ag—0.5% Li—1% Cu | 0.7 | A |
| 81 | Ag—0.5% Li—2% Cu | 0.7 | A |
| 82 | Ag—0.5% Li—3% Cu | 0.7 | A |
| 83 | Ag—1% Li—0.1% Cu | 0.6 | A |
| 84 | Ag—1% Li—0.2% Cu | 0.6 | A |
| 85 | Ag—1% Li—0.5% Cu | 0.6 | A |
| 86 | Ag—1% Li—1% Cu | 0.6 | A |
| 87 | Ag—1% Li—2% Cu | 0.6 | A |
| 88 | Ag—1% Li—3% Cu | 0.6 | A |
| 89 | Ag—2% Li—0.1% Cu | 0.6 | A |
| 90 | Ag—2% Li—0.2% Cu | 0.6 | A |
| 91 | Ag—2% Li—0.5% Cu | 0.6 | A |
| 92 | Ag—2% Li—1% Cu | 0.6 | A |
| 93 | Ag—2% Li—2% Cu | 0.6 | A |
| 94 | Ag—2% Li—3% Cu | 0.6 | A |
| 95 | Ag—0.1% Li—0.1% Au | 0.7 | A |
| 96 | Ag—0.1% Li—0.2% Au | 0.7 | A |
| 97 | Ag—0.1% Li—0.5% Au | 0.7 | A |
| 98 | Ag—0.1% Li—1% Au | 0.7 | A |
| 99 | Ag—0.1% Li—2% Au | 0.7 | A |
| 100 | Ag—0.1% Li—3% Au | 0.7 | A |
| 101 | Ag—0.5% Li—0.1% Au | 0.7 | A |
| 102 | Ag—0.5% Li—0.2% Au | 0.7 | A |
| 103 | Ag—0.5% Li—0.5% Au | 0.7 | A |
| 104 | Ag—0.5% Li—1% Au | 0.7 | A |
| 105 | Ag—0.5% Li—2% Au | 0.7 | A |

TABLE 3-continued

| Sample No. | Film Composition | Change in average surface roughness (nm) | Cohesion resistance (cohesion caused by heat) |
|---|---|---|---|
| 106 | Ag—0.5% Li—3% Au | 0.7 | A |
| 107 | Ag—1% Li—0.1% Au | 0.6 | A |
| 108 | Ag—1% Li—0.2% Au | 0.6 | A |
| 109 | Ag—1% Li—0.5% Au | 0.6 | A |
| 110 | Ag—1% Li—1% Au | 0.6 | A |
| 111 | Ag—1% Li—2% Au | 0.6 | A |
| 112 | Ag—1% Li—3% Au | 0.6 | A |
| 113 | Ag—2% Li—0.1% Au | 0.6 | A |
| 114 | Ag—2% Li—0.2% Au | 0.6 | A |
| 115 | Ag—2% Li—0.5% Au | 0.6 | A |
| 116 | Ag—2% Li—1% Au | 0.6 | A |
| 117 | Ag—2% Li—2% Au | 0.6 | A |
| 118 | Ag—2% Li—3% Au | 0.6 | A |
| 119 | Ag—1% Li—0.2% Bi—0.5% Nd | 0.2 | A |
| 120 | Ag—2% Li—0.2% Bi—0.5% Nd | 0.2 | A |
| 121 | Ag—4% Li—0.2% Bi—0.5% Nd | 0.2 | A |
| 122 | Ag—1% Li—0.2% Bi—2% Cu | 0.4 | A |
| 123 | Ag—2% Li—0.2% Bi—2% Cu | 0.4 | A |
| 124 | Ag—4% Li—0.2% Bi—2% Cu | 0.4 | A |
| 125 | Ag—1% Li—0.2% Bi—2% Au | 0.4 | A |
| 126 | Ag—2% Li—0.2% Bi—2% Au | 0.4 | A |
| 127 | Ag—4% Li—0.2% Bi—2% Au | 0.4 | A |
| 128 | Ag—1% Li—0.5% Nd—2% Cu | 0.4 | A |
| 129 | Ag—1% Li—0.5% Nd—2% Au | 0.4 | A |
| 130 | Ag—2% Li—0.5% Nd—2% Cu | 0.4 | A |
| 131 | Ag—2% Li—0.5% Nd—2% Au | 0.4 | A |
| 132 | Ag—4% Li—0.5% Nd—2% Cu | 0.4 | A |
| 133 | Ag—4% Li—0.5% Nd—2% Au | 0.4 | A |
| 134 | Ag—1% Li—0.2% Bi—0.5% Nd—2% Cu | 0.2 | A |
| 135 | Ag—1% Li—0.2% Bi—0.5% Nd—2% Au | 0.2 | A |
| 136 | Ag—1% Li—0.2% Bi—0.5% Nd—1% Cu—1% Au | 0.2 | A |
| 137 | Ag—2% Li—0.2% Bi—0.5% Nd—2% Cu | 0.2 | A |
| 138 | Ag—2% Li—0.2% Bi—0.5% Nd—2% Au | 0.2 | A |
| 139 | Ag—2% Li—0.2% Bi—0.5% Nd—1% Cu—1% Au | 0.2 | A |

TABLE 4

| Sample No. | Film Composition | Change in average surface roughness (nm) | Cohesion resistance (cohesion caused by a halogen) |
|---|---|---|---|
| 1 | Ag | 10.8 | B |
| 2 | Ag—3% Au | 0.4 | A |
| 3 | Ag—3% Pd | 0.5 | A |
| 4 | Ag—3% Pt | 0.6 | A |
| 5 | Ag—0.01% Li | 0.8 | A |
| 6 | Ag—4% Li | 0.7 | A |
| 7 | Ag—10% Li | 0.5 | A |
| 8 | Ag—16% Li | 0.5 | A |
| 9 | Ag—4% Li—0.1% Bi | 0.4 | A |
| 10 | Ag—4% Li—0.4% Nd | 0.7 | A |
| 11 | Ag—4% Li—0.4% Y | 0.7 | A |
| 12 | Ag—4% Li—0.5% Cu | 0.5 | A |
| 13 | Ag—4% Li—0.5% Au | 0.5 | A |
| 14 | Ag—4% Li—0.1% Bi—0.4% Nd | 0.4 | A |
| 15 | Ag—4% Li—0.1% Bi—0.4% Y | 0.4 | A |
| 16 | Ag—4% Li—0.1% Bi—0.5% Cu | 0.3 | A |
| 17 | Ag—4% Li—0.1% Bi—0.5% Au | 0.3 | A |
| 18 | Ag—4% Li—0.4% Nd—0.5% Cu | 0.5 | A |
| 19 | Ag—4% Li—0.4% Nd—0.5% Au | 0.5 | A |
| 20 | Ag—4% Li—0.4% Y—0.5% Cu | 0.5 | A |
| 21 | Ag—4% Li—0.4% Y—0.5% Au | 0.5 | A |
| 22 | Ag—4% Li—0.1% Bi—0.4% Nd—0.5% Cu | 0.3 | A |
| 23 | Ag—4% Li—0.1% Bi—0.4% Nd—0.5% Au | 0.3 | A |
| 24 | Ag—4% Li—0.1% Bi—0.4% Y—0.5% Cu | 0.3 | A |
| 25 | Ag—4% Li—0.1% Bi—0.4% Y—0.5% Au | 0.3 | A |
| 26 | Ag—0.05% Li | 0.8 | A |
| 27 | Ag—0.1% Li | 0.8 | A |
| 28 | Ag—0.5% Li | 0.8 | A |
| 29 | Ag—1% Li | 0.7 | A |
| 30 | Ag—2% Li | 0.7 | A |
| 31 | Ag—0.1% Li—0.005% Bi | 0.6 | A |
| 32 | Ag—0.1% Li—0.01% Bi | 0.6 | A |
| 33 | Ag—0.1% Li—0.05% Bi | 0.6 | A |
| 34 | Ag—0.1% Li—0.1% Bi | 0.5 | A |
| 35 | Ag—0.1% Li—0.2% Bi | 0.5 | A |
| 36 | Ag—0.5% Li—0.005% Bi | 0.6 | A |
| 37 | Ag—0.5% Li—0.01% Bi | 0.6 | A |
| 38 | Ag—0.5% Li—0.05% Bi | 0.6 | A |
| 39 | Ag—0.5% Li—0.1% Bi | 0.5 | A |
| 40 | Ag—0.5% Li—0.2% Bi | 0.5 | A |
| 41 | Ag—1% Li—0.005% Bi | 0.5 | A |
| 42 | Ag—1% Li—0.01% Bi | 0.5 | A |
| 43 | Ag—1% Li—0.05% Bi | 0.5 | A |
| 44 | Ag—1% Li—0.1% Bi | 0.4 | A |
| 45 | Ag—1% Li—0.2% Bi | 0.4 | A |
| 46 | Ag—2% Li—0.005% Bi | 0.5 | A |
| 47 | Ag—2% Li—0.01% Bi | 0.5 | A |
| 48 | Ag—2% Li—0.05% Bi | 0.5 | A |
| 49 | Ag—2% Li—0.1% Bi | 0.4 | A |
| 50 | Ag—2% Li—0.2% Bi | 0.4 | A |
| 51 | Ag—0.1% Li—0.1% Nd | 0.8 | A |
| 52 | Ag—0.1% Li—0.2% Nd | 0.8 | A |
| 53 | Ag—0.1% Li—0.5% Nd | 0.8 | A |
| 54 | Ag—0.1% Li—1% Nd | 0.8 | A |
| 55 | Ag—0.1% Li—2% Nd | 0.8 | A |
| 56 | Ag—0.5% Li—0.1% Nd | 0.8 | A |
| 57 | Ag—0.5% Li—0.2% Nd | 0.8 | A |
| 58 | Ag—0.5% Li—0.5% Nd | 0.8 | A |
| 59 | Ag—0.5% Li—1% Nd | 0.8 | A |
| 60 | Ag—0.5% Li—2% Nd | 0.8 | A |
| 61 | Ag—1% Li—0.1% Nd | 0.7 | A |
| 62 | Ag—1% Li—0.2% Nd | 0.7 | A |
| 63 | Ag—1% Li—0.5% Nd | 0.7 | A |
| 64 | Ag—1% Li—1% Nd | 0.7 | A |
| 65 | Ag—1% Li—2% Nd | 0.7 | A |
| 66 | Ag—2% Li—0.1% Nd | 0.7 | A |
| 67 | Ag—2% Li—0.2% Nd | 0.7 | A |
| 68 | Ag—2% Li—0.5% Nd | 0.7 | A |
| 69 | Ag—2% Li—1% Nd | 0.7 | A |
| 70 | Ag—2% Li—2% Nd | 0.7 | A |
| 71 | Ag—0.1% Li—0.1% Cu | 0.7 | A |
| 72 | Ag—0.1% Li—0.2% Cu | 0.7 | A |
| 73 | Ag—0.1% Li—0.5% Cu | 0.6 | A |
| 74 | Ag—0.1% Li—1% Cu | 0.5 | A |
| 75 | Ag—0.1% Li—2% Cu | 0.5 | A |
| 76 | Ag—0.1% Li—3% Cu | 0.4 | A |
| 77 | Ag—0.5% Li—0.1% Cu | 0.7 | A |
| 78 | Ag—0.5% Li—0.2% Cu | 0.7 | A |
| 79 | Ag—0.5% Li—0.5% Cu | 0.6 | A |
| 80 | Ag—0.5% Li—1% Cu | 0.5 | A |
| 81 | Ag—0.5% Li—2% Cu | 0.5 | A |
| 82 | Ag—0.5% Li—3% Cu | 0.4 | A |
| 83 | Ag—1% Li—0.1% Cu | 0.6 | A |
| 84 | Ag—1% Li—0.2% Cu | 0.6 | A |
| 85 | Ag—1% Li—0.5% Cu | 0.5 | A |
| 86 | Ag—1% Li—1% Cu | 0.4 | A |
| 87 | Ag—1% Li—2% Cu | 0.4 | A |

TABLE 4-continued

| Sample No. | Film Composition | Change in average surface roughness (nm) | Cohesion resistance (cohesion caused by a halogen) |
|---|---|---|---|
| 88 | Ag—1% Li—3% Cu | 0.3 | A |
| 89 | Ag—2% Li—0.1% Cu | 0.6 | A |
| 90 | Ag—2% Li—0.2% Cu | 0.6 | A |
| 91 | Ag—2% Li—0.5% Cu | 0.5 | A |
| 92 | Ag—2% Li—1% Cu | 0.4 | A |
| 93 | Ag—2% Li—2% Cu | 0.4 | A |
| 94 | Ag—2% Li—3% Cu | 0.3 | A |
| 95 | Ag—0.1% Li—0.1% Au | 0.7 | A |
| 96 | Ag—0.1% Li—0.2% Au | 0.7 | A |
| 97 | Ag—0.1% Li—0.5% Au | 0.6 | A |
| 98 | Ag—0.1% Li—1% Au | 0.5 | A |
| 99 | Ag—0.1% Li—2% Au | 0.5 | A |
| 100 | Ag—0.1% Li—3% Au | 0.4 | A |
| 101 | Ag—0.5% Li—0.1% Au | 0.7 | A |
| 102 | Ag—0.5% Li—0.2% Au | 0.7 | A |
| 103 | Ag—0.5% Li—0.5% Au | 0.6 | A |
| 104 | Ag—0.5% Li—1% Au | 0.5 | A |
| 105 | Ag—0.5% Li—2% Au | 0.5 | A |
| 106 | Ag—0.5% Li—3% Au | 0.4 | A |
| 107 | Ag—1% Li—0.1% Au | 0.6 | A |
| 108 | Ag—1% Li—0.2% Au | 0.6 | A |
| 109 | Ag—1% Li—0.5% Au | 0.5 | A |
| 110 | Ag—1% Li—1% Au | 0.4 | A |
| 111 | Ag—1% Li—2% Au | 0.4 | A |
| 112 | Ag—1% Li—3% Au | 0.3 | A |
| 113 | Ag—2% Li—0.1% Au | 0.6 | A |
| 114 | Ag—2% Li—0.2% Au | 0.6 | A |
| 115 | Ag—2% Li—0.5% Au | 0.5 | A |
| 116 | Ag—2% Li—1% Au | 0.4 | A |
| 117 | Ag—2% Li—2% Au | 0.4 | A |
| 118 | Ag—2% Li—3% Au | 0.3 | A |
| 119 | Ag—1% Li—0.2% Bi—0.5% Nd | 0.4 | A |
| 120 | Ag—2% Li—0.2% Bi—0.5% Nd | 0.4 | A |
| 121 | Ag—4% Li—0.2% Bi—0.5% Nd | 0.4 | A |
| 122 | Ag—1% Li—0.2% Bi—2% Cu | 0.1 | A |
| 123 | Ag—2% Li—0.2% Bi—2% Cu | 0.1 | A |
| 124 | Ag—4% Li—0.2% Bi—2% Cu | 0.1 | A |
| 125 | Ag—1% Li—0.2% Bi—2% Au | 0.1 | A |
| 126 | Ag—2% Li—0.2% Bi—2% Au | 0.1 | A |
| 127 | Ag—4% Li—0.2% Bi—2% Au | 0.1 | A |
| 128 | Ag—1% Li—0.5% Nd—2% Cu | 0.4 | A |
| 129 | Ag—1% Li—0.5% Nd—2% Au | 0.4 | A |
| 130 | Ag—2% Li—0.5% Nd—2% Cu | 0.4 | A |
| 131 | Ag—2% Li—0.5% Nd—2% Au | 0.4 | A |
| 132 | Ag—4% Li—0.5% Nd—2% Cu | 0.4 | A |
| 133 | Ag—4% Li—0.5% Nd—2% Au | 0.4 | A |
| 134 | Ag—1% Li—0.2% Bi—0.5% Nd—2% Cu | 0.1 | A |
| 135 | Ag—1% Li—0.2% Bi—0.5% Nd—2% Au | 0.1 | A |
| 136 | Ag—1% Li—0.2% Bi—0.5% Nd—1% Cu—1% Au | 0.1 | A |
| 137 | Ag—2% Li—0.2% Bi—0.5% Nd—2% Cu | 0.1 | A |
| 138 | Ag—2% Li—0.2% Bi—0.5% Nd—2% Au | 0.1 | A |
| 139 | Ag—2% Li—0.2% Bi—0.5% Nd—1% Cu—1% Au | 0.1 | A |

TABLE 5

| Sample No. | Film Composition | Change in average surface roughness (nm) | Heat resistance |
|---|---|---|---|
| 1 | Ag | 5.5 | C |
| 2 | Ag—3% Au | 5.2 | C |
| 3 | Ag—3% Pd | 5.1 | C |
| 4 | Ag—3% Pt | 5.3 | C |
| 5 | Ag—0.01% Li | 2.6 | B |
| 6 | Ag—4% Li | 2.1 | B |
| 7 | Ag—10% Li | 1.8 | B |
| 8 | Ag—16% Li | 1.7 | B |
| 9 | Ag—4% Li—0.1% Bi | 1.7 | B |
| 10 | Ag—4% Li—0.4% Nd | 0.4 | A |
| 11 | Ag—4% Li—0.4% Y | 0.4 | A |
| 12 | Ag—4% Li—0.5% Cu | 2.1 | B |
| 13 | Ag—4% Li—0.5% Au | 2.1 | B |
| 14 | Ag—4% Li—0.1% Bi—0.4% Nd | 0.3 | A |
| 15 | Ag—4% Li—0.1% Bi—0.4% Y | 0.3 | A |
| 16 | Ag—4% Li—0.1% Bi—0.5% Cu | 1.6 | B |
| 17 | Ag—4% Li—0.1% Bi—0.5% Au | 1.6 | B |
| 18 | Ag—4% Li—0.4% Nd—0.5% Cu | 0.4 | A |
| 19 | Ag—4% Li—0.4% Nd—0.5% Au | 0.4 | A |
| 20 | Ag—4% Li—0.4% Y—0.5% Cu | 0.4 | A |
| 21 | Ag—4% Li—0.4% Y—0.5% Au | 0.4 | A |
| 22 | Ag—4% Li—0.1% Bi—0.4% Nd—0.5% Cu | 0.3 | A |
| 23 | Ag—4% Li—0.1% Bi—0.4% Nd—0.5% Au | 0.3 | A |
| 24 | Ag—4% Li—0.1% Bi—0.4% Y—0.5% Cu | 0.3 | A |
| 25 | Ag—4% Li—0.1% Bi—0.4% Y—0.5% Au | 0.3 | A |
| 26 | Ag—0.05% Li | 2.6 | B |
| 27 | Ag—0.1% Li | 2.6 | B |
| 28 | Ag—0.5% Li | 2.5 | B |
| 29 | Ag—1% Li | 2.4 | B |
| 30 | Ag—2% Li | 2.3 | B |
| 31 | Ag—0.1% Li—0.005% Bi | 2.3 | B |
| 32 | Ag—0.1% Li—0.01% Bi | 2.3 | B |
| 33 | Ag—0.1% Li—0.05% Bi | 2.3 | B |
| 34 | Ag—0.1% Li—0.1% Bi | 2.2 | B |
| 35 | Ag—0.1% Li—0.2% Bi | 2.2 | B |
| 36 | Ag—0.5% Li—0.005% Bi | 2.2 | B |
| 37 | Ag—0.5% Li—0.1% Bi | 2.2 | B |
| 38 | Ag—0.5% Li—0.01% Bi | 2.2 | B |
| 39 | Ag—0.5% Li—0.1% Bi | 2.1 | B |
| 40 | Ag—0.5% Li—0.2% Bi | 2.1 | B |
| 41 | Ag—1% Li—0.005% Bi | 2.1 | B |
| 42 | Ag—1% Li—0.01% Bi | 2.1 | B |
| 43 | Ag—1% Li—0.05% Bi | 2.1 | B |
| 44 | Ag—1% Li—0.1% Bi | 2.0 | B |
| 45 | Ag—1% Li—0.2% Bi | 2.0 | B |
| 46 | Ag—2% Li—0.005% Bi | 2.0 | B |
| 47 | Ag—2% Li—0.01% Bi | 2.0 | B |
| 48 | Ag—2% Li—0.05% Bi | 2.0 | B |
| 49 | Ag—2% Li—0.1% Bi | 1.9 | B |
| 50 | Ag—2% Li—0.2% Bi | 1.9 | B |
| 51 | Ag—0.1% Li—0.1% Nd | 1.4 | A |
| 52 | Ag—0.1% Li—0.2% Nd | 1.1 | A |
| 53 | Ag—0.1% Li—0.5% Nd | 0.8 | A |
| 54 | Ag—0.1% Li—1% Nd | 0.7 | A |
| 55 | Ag—0.1% Li—2% Nd | 0.6 | A |
| 56 | Ag—0.5% Li—0.1% Nd | 1.3 | A |
| 57 | Ag—0.5% Li—0.2% Nd | 1.0 | A |
| 58 | Ag—0.5% Li—0.5% Nd | 0.7 | A |
| 59 | Ag—0.5% Li—1% Nd | 0.6 | A |
| 60 | Ag—0.5% Li—2% Nd | 0.5 | A |
| 61 | Ag—1% Li—0.1% Nd | 1.2 | A |
| 62 | Ag—1% Li—0.2% Nd | 0.9 | A |
| 63 | Ag—1% Li—0.5% Nd | 0.6 | A |
| 64 | Ag—1% Li—1% Nd | 0.5 | A |
| 65 | Ag—1% Li—2% Nd | 0.4 | A |
| 66 | Ag—2% Li—0.1% Nd | 1.1 | A |
| 67 | Ag—2% Li—0.2% Nd | 0.8 | A |
| 68 | Ag—2% Li—0.5% Nd | 0.5 | A |
| 69 | Ag—2% Li—1% Nd | 0.4 | A |
| 70 | Ag—2% Li—2% Nd | 0.3 | A |
| 71 | Ag—0.1% Li—0.1% Cu | 2.6 | B |
| 72 | Ag—0.1% Li—0.2% Cu | 2.6 | B |
| 73 | Ag—0.1% Li—0.5% Cu | 2.6 | B |
| 74 | Ag—0.1% Li—1% Cu | 2.6 | B |
| 75 | Ag—0.1% Li—2% Cu | 2.6 | B |

TABLE 5-continued

| Sample No. | Film Composition | Change in average surface roughness (nm) | Heat resistance |
|---|---|---|---|
| 76 | Ag—0.1% Li—3% Cu | 2.6 | B |
| 77 | Ag—0.5% Li—0.1% Cu | 2.5 | B |
| 78 | Ag—0.5% Li—0.2% Cu | 2.5 | B |
| 79 | Ag—0.5% Li—0.5% Cu | 2.5 | B |
| 80 | Ag—0.5% Li—1% Cu | 2.5 | B |
| 81 | Ag—0.5% Li—2% Cu | 2.5 | B |
| 82 | Ag—0.5% Li—3% Cu | 2.5 | B |
| 83 | Ag—1% Li—0.1% Cu | 2.4 | B |
| 84 | Ag—1% Li—0.2% Cu | 2.4 | B |
| 85 | Ag—1% Li—0.5% Cu | 2.4 | B |
| 86 | Ag—1% Li—1% Cu | 2.4 | B |
| 87 | Ag—1% Li—2% Cu | 2.4 | B |
| 88 | Ag—1% Li—3% Cu | 2.4 | B |
| 89 | Ag—2% Li—0.1% Cu | 2.3 | B |
| 90 | Ag—2% Li—0.2% Cu | 2.3 | B |
| 91 | Ag—2% Li—0.5% Cu | 2.3 | B |
| 92 | Ag—2% Li—1% Cu | 2.3 | B |
| 93 | Ag—2% Li—2% Cu | 2.3 | B |
| 94 | Ag—2% Li—3% Cu | 2.3 | B |
| 95 | Ag—0.1% Li—0.1% Au | 2.6 | B |
| 96 | Ag—0.1% Li—0.2% Au | 2.6 | B |
| 97 | Ag—0.1% Li—0.5% Au | 2.6 | B |
| 98 | Ag—0.1% Li—1% Au | 2.6 | B |
| 99 | Ag—0.1% Li—2% Au | 2.6 | B |
| 100 | Ag—0.1% Li—3% Au | 2.6 | B |
| 101 | Ag—0.5% Li—0.1% Au | 2.5 | B |
| 102 | Ag—0.5% Li—0.2% Au | 2.5 | B |
| 103 | Ag—0.5% Li—0.5% Au | 2.5 | B |
| 104 | Ag—0.5% Li—1% Au | 2.5 | B |
| 105 | Ag—0.5% Li—2% Au | 2.5 | B |
| 106 | Ag—0.5% Li—3% Au | 2.5 | B |
| 107 | Ag—1% Li—0.1% Au | 2.4 | B |
| 108 | Ag—1% Li—0.2% Au | 2.4 | B |
| 109 | Ag—1% Li—0.5% Au | 2.4 | B |
| 110 | Ag—1% Li—1% Au | 2.4 | B |
| 111 | Ag—1% Li—2% Au | 2.4 | B |
| 112 | Ag—1% Li—3% Au | 2.4 | B |
| 113 | Ag—2% Li—0.1% Au | 2.3 | B |
| 114 | Ag—2% Li—0.2% Au | 2.3 | B |
| 115 | Ag—2% Li—0.5% Au | 2.3 | B |
| 116 | Ag—2% Li—1% Au | 2.3 | B |
| 117 | Ag—2% Li—2% Au | 2.3 | B |
| 118 | Ag—2% Li—3% Au | 2.3 | B |
| 119 | Ag—1% Li—0.2% Bi—0.5% Nd | 0.2 | A |
| 120 | Ag—2% Li—0.2% Bi—0.5% Nd | 0.1 | A |
| 121 | Ag—4% Li—0.2% Bi—0.5% Nd | 0.0 | A |
| 122 | Ag—1% Li—0.2% Bi—2% Cu | 2.0 | B |
| 123 | Ag—2% Li—0.2% Bi—2% Cu | 2.0 | B |
| 124 | Ag—4% Li—0.2% Bi—2% Cu | 2.0 | B |
| 125 | Ag—1% Li—0.2% Bi—2% Au | 2.0 | B |
| 126 | Ag—2% Li—0.2% Bi—2% Au | 2.0 | B |
| 127 | Ag—4% Li—0.2% Bi—2% Au | 2.0 | B |
| 128 | Ag—1% Li—0.5% Nd—2% Cu | 0.6 | A |
| 129 | Ag—1% Li—0.5% Nd—2% Au | 0.6 | A |
| 130 | Ag—2% Li—0.5% Nd—2% Cu | 0.5 | A |
| 131 | Ag—2% Li—0.5% Nd—2% Au | 0.5 | A |
| 132 | Ag—4% Li—0.5% Nd—2% Cu | 0.3 | A |
| 133 | Ag—4% Li—0.5% Nd—2% Au | 0.3 | A |
| 134 | Ag—1% Li—0.2% Bi—0.5% Nd—2% Cu | 0.2 | A |
| 135 | Ag—1% Li—0.2% Bi—0.5% Nd—2% Au | 0.2 | A |
| 136 | Ag—1% Li—0.2% Bi—0.5% Nd—1% Cu—1% Au | 0.2 | A |
| 137 | Ag—2% Li—0.2% Bi—0.5% Nd—2% Cu | 0.1 | A |
| 138 | Ag—2% Li—0.2% Bi—0.5% Nd—2% Au | 0.1 | A |
| 139 | Ag—2% Li—0.2% Bi—0.5% Nd—1% Cu—1% Au | 0.1 | A |

TABLE 6

| Sample No. | Film Composition | Reflectivity (%) | | Transmissivity (%) | | Absorptivity (%) | |
|---|---|---|---|---|---|---|---|
| 1 | Ag | 18.0 | A | 68.0 | A | 14.0 | A |
| 2 | Ag—3% Au | 17.0 | A | 66.2 | A | 16.8 | A |
| 3 | Ag—3% Pd | 16.7 | A | 65.5 | A | 17.8 | A |
| 4 | Ag—3% Pt | 16.5 | A | 64.8 | A | 18.7 | A |
| 5 | Ag—0.01% Li | 17.5 | A | 67.5 | A | 15.0 | A |
| 6 | Ag—4% Li | 17.3 | A | 66.0 | A | 16.7 | A |
| 7 | Ag—10% Li | 16.0 | A | 62.3 | A | 21.7 | A |
| 8 | Ag—16% Li | 14.2 | B | 58.7 | B | 27.1 | B |
| 9 | Ag—4% Li—0.1% Bi | 16.9 | A | 64.2 | A | 18.9 | A |
| 10 | Ag—4% Li—0.4% Nd | 17.0 | A | 65.5 | A | 17.5 | A |
| 11 | Ag—4% Li—0.4% Y | 16.9 | A | 65.4 | A | 17.7 | A |
| 12 | Ag—4% Li—0.5% Cu | 17.0 | A | 65.5 | A | 17.5 | A |
| 13 | Ag—4% Li—0.5% Au | 17.1 | A | 65.6 | A | 17.3 | A |
| 14 | Ag—4% Li—0.1% Bi—0.4% Nd | 16.6 | A | 63.7 | A | 19.7 | A |
| 15 | Ag—4% Li—0.1% Bi—0.4% Y | 16.5 | A | 63.6 | A | 19.9 | A |
| 16 | Ag—4% Li—0.1% Bi—0.5% Cu | 16.6 | A | 63.7 | A | 19.7 | A |
| 17 | Ag—4% Li—0.1% Bi—0.5% Au | 16.7 | A | 63.8 | A | 19.5 | A |
| 18 | Ag—4% Li—0.4% Nd—0.5% Cu | 16.7 | A | 65.0 | A | 18.3 | A |
| 19 | Ag—4% Li—0.4% Nd—0.5% Au | 16.8 | A | 65.1 | A | 18.1 | A |
| 20 | Ag—4% Li—0.4% Y—0.5% Cu | 16.6 | A | 64.9 | A | 18.5 | A |
| 21 | Ag—4% Li—0.4% Y—0.5% Au | 16.7 | A | 65.0 | A | 18.3 | A |
| 22 | Ag—4% Li—0.1% Bi—0.4% Nd—0.5% Cu | 16.3 | A | 63.3 | A | 20.4 | A |
| 23 | Ag—4% Li—0.1% Bi—0.4% Nd—0.5% Au | 16.4 | A | 63.4 | A | 20.2 | A |
| 24 | Ag—4% Li—0.1% Bi—0.4% Y—0.5% Cu | 16.2 | A | 63.2 | A | 20.6 | A |
| 25 | Ag—4% Li—0.1% Bi—0.4% Y—0.5% Au | 16.3 | A | 63.3 | A | 20.4 | A |
| 26 | Ag—0.05% Li | 17.5 | A | 67.5 | A | 15.0 | A |
| 27 | Ag—0.1% Li | 17.5 | A | 67.5 | A | 15.0 | A |
| 28 | Ag—0.5% Li | 17.5 | A | 67.3 | A | 15.2 | A |
| 29 | Ag—1% Li | 17.4 | A | 67.1 | A | 15.5 | A |
| 30 | Ag—2% Li | 17.4 | A | 66.7 | A | 15.9 | A |
| 31 | Ag—0.1% Li—0.005% Bi | 17.5 | A | 67.4 | A | 15.1 | A |
| 32 | Ag—0.1% Li—0.01% Bi | 17.5 | A | 67.3 | A | 15.2 | A |
| 33 | Ag—0.1% Li—0.05% Bi | 17.3 | A | 66.6 | A | 16.1 | A |
| 34 | Ag—0.1% Li—0.1% Bi | 17.1 | A | 65.7 | A | 17.2 | A |
| 35 | Ag—0.1% Li—0.2% Bi | 16.7 | A | 63.9 | A | 19.4 | A |
| 36 | Ag—0.5% Li—0.005% Bi | 17.5 | A | 67.2 | A | 15.3 | A |
| 37 | Ag—0.5% Li—0.01% Bi | 17.4 | A | 67.1 | A | 15.5 | A |
| 38 | Ag—0.5% Li—0.05% Bi | 17.3 | A | 66.4 | A | 16.3 | A |

TABLE 6-continued

| Sample No. | Film Composition | Reflectivity (%) | | Transmissivity (%) | | Absorptivity (%) | |
|---|---|---|---|---|---|---|---|
| 39 | Ag—0.5% Li—0.1% Bi | 17.1 | A | 65.5 | A | 17.4 | A |
| 40 | Ag—0.5% Li—0.2% Bi | 16.7 | A | 63.7 | A | 19.6 | A |
| 41 | Ag—1% Li—0.005% Bi | 17.4 | A | 67.0 | A | 15.6 | A |
| 42 | Ag—1% Li—0.01% Bi | 17.4 | A | 66.9 | A | 15.7 | A |
| 43 | Ag—1% Li—0.05% Bi | 17.2 | A | 66.2 | A | 16.6 | A |
| 44 | Ag—1% Li—0.1% Bi | 17.0 | A | 65.3 | A | 17.7 | A |
| 45 | Ag—1% Li—0.2% Bi | 16.6 | A | 63.5 | A | 19.9 | A |
| 46 | Ag—2% Li—0.005% Bi | 17.4 | A | 66.7 | A | 15.9 | A |
| 47 | Ag—2% Li—0.01% Bi | 17.4 | A | 66.6 | A | 16.0 | A |
| 48 | Ag—2% Li—0.05% Bi | 17.2 | A | 65.8 | A | 17.0 | A |
| 49 | Ag—2% Li—0.1% Bi | 17.0 | A | 64.9 | A | 18.1 | A |
| 50 | Ag—2% Li—0.2% Bi | 16.6 | A | 63.1 | A | 20.3 | A |
| 51 | Ag—0.1% Li—0.1% Nd | 17.4 | A | 67.3 | A | 15.3 | A |
| 52 | Ag—0.1% Li—0.2% Nd | 17.3 | A | 67.2 | A | 15.5 | A |
| 53 | Ag—0.1% Li—0.5% Nd | 17.1 | A | 66.8 | A | 16.1 | A |
| 54 | Ag—0.1% Li—1% Nd | 16.7 | A | 66.2 | A | 17.1 | A |
| 55 | Ag—0.1% Li—2% Nd | 16.0 | A | 65.0 | A | 19.0 | A |
| 56 | Ag—0.5% Li—0.1% Nd | 17.4 | A | 67.2 | A | 15.4 | A |
| 57 | Ag—0.5% Li—0.2% Nd | 17.3 | A | 67.1 | A | 15.6 | A |
| 58 | Ag—0.5% Li—0.5% Nd | 17.1 | A | 66.7 | A | 16.2 | A |
| 59 | Ag—0.5% Li—1% Nd | 16.7 | A | 66.1 | A | 17.2 | A |
| 60 | Ag—0.5% L—2% Nd | 16.0 | A | 64.8 | A | 19.2 | A |
| 61 | Ag—1% Li—0.1% Nd | 17.4 | A | 67.0 | A | 15.6 | A |
| 62 | Ag—1% Li—0.2% Nd | 17.3 | A | 66.9 | A | 15.8 | A |
| 63 | Ag—1% Li—0.5% Nd | 17.1 | A | 66.5 | A | 16.4 | A |
| 64 | Ag—1% Li—1% Nd | 16.7 | A | 65.9 | A | 17.4 | A |
| 65 | Ag—1% Li—2% Nd | 15.9 | A | 64.6 | A | 19.5 | A |
| 66 | Ag—2% Li—0.1% Nd | 17.3 | A | 66.6 | A | 16.1 | A |
| 67 | Ag—2% Li—0.2% Nd | 17.2 | A | 66.5 | A | 16.3 | A |
| 68 | Ag—2% Li—0.5% Nd | 17.0 | A | 66.1 | A | 16.9 | A |
| 69 | Ag—2% Li—1% Nd | 16.6 | A | 65.5 | A | 17.9 | A |
| 70 | Ag—2% Li—2% Nd | 15.9 | A | 64.2 | A | 19.9 | A |
| 71 | Ag—0.1% Li—0.1% Cu | 17.4 | A | 67.4 | A | 15.2 | A |
| 72 | Ag—0.1% Li—0.2% Cu | 17.4 | A | 67.3 | A | 15.3 | A |
| 73 | Ag—0.1% Li—0.5% Cu | 17.2 | A | 67.0 | A | 15.8 | A |
| 74 | Ag—0.1% Li—1% Cu | 16.9 | A | 66.5 | A | 16.6 | A |
| 75 | Ag—0.1% Li—2% Cu | 16.3 | A | 65.5 | A | 18.2 | A |
| 76 | Ag—0.1% Li—3% Cu | 15.7 | A | 64.5 | A | 19.8 | A |
| 77 | Ag—0.5% Li—0.1% Cu | 17.4 | A | 67.2 | A | 15.4 | A |
| 78 | Ag—0.5% Li—0.2% Cu | 17.4 | A | 67.1 | A | 15.5 | A |
| 79 | Ag—0.5% Li—0.5% Cu | 17.2 | A | 66.8 | A | 16.0 | A |
| 80 | Ag—0.5% Li—1% Cu | 16.9 | A | 66.3 | A | 16.8 | A |
| 81 | Ag—0.5% Li—2% Cu | 16.3 | A | 65.3 | A | 18.4 | A |
| 82 | Ag—0.5% Li—3% Cu | 15.7 | A | 64.3 | A | 20.0 | A |
| 83 | Ag—1% Li—0.1% Cu | 17.4 | A | 67.0 | A | 15.6 | A |
| 84 | Ag—1% Li—0.2% Cu | 17.3 | A | 66.9 | A | 15.8 | A |
| 85 | Ag—1% Li—0.5% Cu | 17.1 | A | 66.6 | A | 16.3 | A |
| 86 | Ag—1% Li—1% Cu | 16.8 | A | 66.1 | A | 17.1 | A |
| 87 | Ag—1% Li—2% Cu | 16.2 | A | 65.1 | A | 18.7 | A |
| 88 | Ag—1% Li—3% Cu | 15.6 | A | 64.1 | A | 20.3 | A |
| 89 | Ag—2% Li—0.1% Cu | 17.3 | A | 66.6 | A | 16.1 | A |
| 90 | Ag—2% Li—0.2% Cu | 17.3 | A | 66.5 | A | 16.2 | A |
| 91 | Ag—2% Li—0.5% Cu | 17.1 | A | 66.2 | A | 16.7 | A |
| 92 | Ag—2% Li—1% Cu | 16.8 | A | 65.7 | A | 17.5 | A |
| 93 | Ag—2% Li—2% Cu | 16.2 | A | 64.7 | A | 19.1 | A |
| 94 | Ag—2% Li—3% Cu | 15.6 | A | 63.7 | A | 20.7 | A |
| 95 | Ag—0.1% Li—0.1% Au | 17.5 | A | 67.4 | A | 15.1 | A |
| 96 | Ag—0.1% Li—0.2% Au | 17.4 | A | 67.3 | A | 15.3 | A |
| 97 | Ag—0.1% Li—0.5% Au | 17.3 | A | 67.1 | A | 15.6 | A |
| 98 | Ag—0.1% Li—1% Au | 17.1 | A | 66.7 | A | 16.2 | A |
| 99 | Ag—0.1% Li—2% Au | 16.7 | A | 65.9 | A | 17.4 | A |
| 100 | Ag—0.1% Li—3% Au | 16.3 | A | 65.1 | A | 18.6 | A |
| 101 | Ag—0.5% Li—0.1% Au | 17.4 | A | 67.2 | A | 15.4 | A |
| 102 | Ag—0.5% Li—0.2% Au | 17.4 | A | 67.2 | A | 15.4 | A |
| 103 | Ag—0.5% Li—0.5% Au | 17.3 | A | 66.9 | A | 15.8 | A |
| 104 | Ag—0.5% Li—1% Au | 17.1 | A | 66.5 | A | 16.4 | A |
| 105 | Ag—0.5% Li—2% Au | 16.7 | A | 65.7 | A | 17.6 | A |
| 106 | Ag—0.5% Li—3% Au | 16.3 | A | 64.9 | A | 18.8 | A |
| 107 | Ag—1% Li—0.1% Au | 17.4 | A | 67.0 | A | 15.6 | A |
| 108 | Ag—1% Li—0.2% Au | 17.4 | A | 67.0 | A | 15.6 | A |
| 109 | Ag—1% Li—0.5% Au | 17.2 | A | 66.7 | A | 16.1 | A |
| 110 | Ag—1% Li—1% Au | 17.0 | A | 66.3 | A | 16.7 | A |
| 111 | Ag—1% Li—2% Au | 16.6 | A | 65.5 | A | 17.9 | A |
| 112 | Ag—1% Li—3% Au | 16.2 | A | 64.7 | A | 19.1 | A |
| 113 | Ag—2% Li—0.1% Au | 17.4 | A | 66.7 | A | 15.9 | A |
| 114 | Ag—2% Li—0.2% Au | 17.3 | A | 66.6 | A | 16.1 | A |

TABLE 6-continued

| Sample No. | Film Composition | Reflectivity (%) | | Transmissivity (%) | | Absorptivity (%) | |
|---|---|---|---|---|---|---|---|
| 115 | Ag—2% Li—0.5% Au | 17.2 | A | 66.3 | A | 16.5 | A |
| 116 | Ag—2% Li—1% Au | 17.0 | A | 65.9 | A | 17.1 | A |
| 117 | Ag—2% Li—2% Au | 16.6 | A | 65.1 | A | 18.3 | A |
| 118 | Ag—2% Li—3% Au | 16.2 | A | 64.3 | A | 19.5 | A |
| 119 | Ag—1% Li—0.2% Bi—0.5% Nd | 16.3 | A | 62.9 | A | 20.8 | A |
| 120 | Ag—2% Li—0.2% Bi—0.5% Nd | 16.2 | A | 62.5 | A | 21.3 | A |
| 121 | Ag—4% Li—0.2% Bi—0.5% Nd | 16.1 | A | 61.8 | A | 22.1 | A |
| 122 | Ag—1% Li—0.2% Bi—2% Cu | 15.4 | A | 61.5 | A | 23.1 | A |
| 123 | Ag—2% Li—0.2% Bi—2% Cu | 15.4 | A | 61.1 | A | 23.5 | A |
| 124 | Ag—4% Li—0.2% Bi—2% Cu | 15.3 | A | 60.4 | A | 24.3 | A |
| 125 | Ag—1% Li—0.2% Bi—2% Au | 15.8 | A | 61.9 | A | 22.3 | A |
| 126 | Ag—2% Li—0.2% Bi—2% Au | 15.8 | A | 61.5 | A | 22.7 | A |
| 127 | Ag—4% Li—0.2% Bi—2% Au | 15.7 | A | 60.8 | A | 23.5 | A |
| 128 | Ag—1% Li—0.5% Nd—2% Cu | 15.9 | A | 64.5 | A | 19.6 | A |
| 129 | Ag—1% Li—0.5% Nd—2% Au | 16.3 | A | 64.9 | A | 18.8 | A |
| 130 | Ag—2% Li—0.5% Nd—2% Cu | 15.8 | A | 64.1 | A | 20.1 | A |
| 131 | Ag—2% Li—0.5% Nd—2% Au | 16.2 | A | 64.5 | A | 19.3 | A |
| 132 | Ag—4% Li—0.5% Nd—2% Cu | 15.7 | A | 63.4 | A | 20.9 | A |
| 133 | Ag—4% Li—0.5% Nd—2% Au | 16.1 | A | 63.8 | A | 20.1 | A |
| 134 | Ag—1% Li—0.2% Bi—0.5% Nd—2% Cu | 15.1 | A | 60.9 | A | 24.0 | A |
| 135 | Ag—1% Li—0.2% Bi—0.5% Nd—2% Au | 15.5 | A | 61.3 | A | 23.2 | A |
| 136 | Ag—1% Li—0.2% Bi—0.5% Nd—1% Cu—1% Au | 15.3 | A | 61.1 | A | 23.6 | A |
| 137 | Ag—2% Li—0.2% Bi—0.5% Nd—2% Cu | 15.0 | A | 60.5 | A | 24.5 | A |
| 138 | Ag—2% Li—0.2% Bi—0.5% Nd—2% Au | 15.4 | A | 60.9 | A | 23.7 | A |
| 139 | Ag—2% Li—0.2% Bi—0.5% Nd—1% Cu—1% Au | 15.2 | A | 60.7 | A | 24.1 | A |

TABLE 7

| Sample No. | Film Composition | Thermal conductivity (W/(m·K)) | |
|---|---|---|---|
| 1 | Ag | 320 | A |
| 2 | Ag—3% Au | 210 | A |
| 3 | Ag—3% Pd | 165 | A |
| 4 | Ag—3% Pt | 188 | A |
| 5 | Ag—0.01% Li | 319 | A |
| 6 | Ag—4% Li | 258 | A |
| 7 | Ag—10% Li | 165 | A |
| 8 | Ag—16% Li | 72 | B |
| 9 | Ag—4% Li—0.1% Bi | 242 | A |
| 10 | Ag—4% Li—0.4% Nd | 237 | A |
| 11 | Ag—4% Li—0.4% Y | 233 | A |
| 12 | Ag—4% Li—0.5% Cu | 244 | A |
| 13 | Ag—4% Li—0.5% Au | 247 | A |
| 14 | Ag—4% Li—0.1% Bi—0.4% Nd | 221 | A |
| 15 | Ag—4% Li—0.1% Bi—0.4% Y | 217 | A |
| 16 | Ag—4% Li—0.1% Bi—0.5% Cu | 228 | A |
| 17 | Ag—4% Li—0.1% Bi—0.5% Au | 231 | A |
| 18 | Ag—4% Li—0.4% Nd—0.5% Cu | 222 | A |
| 19 | Ag—4% Li—0.4% Nd—0.5% Au | 225 | A |
| 20 | Ag—4% Li—0.4% Y—0.5% Cu | 218 | A |
| 21 | Ag—4% Li—0.4% Y—0.5% Au | 221 | A |
| 22 | Ag—4% Li—0.1% Bi—0.4% Nd—0.5% Cu | 212 | A |
| 23 | Ag—4% Li—0.1% Bi—0.4% Nd—0.5% Au | 216 | A |
| 24 | Ag—4% Li—0.1% Bi—0.4% Y—0.5% Cu | 208 | A |
| 25 | Ag—4% Li—0.1% Bi—0.4% Y—0.5% Au | 212 | A |
| 26 | Ag—0.05% Li | 319 | A |
| 27 | Ag—0.1% Li | 318 | A |
| 28 | Ag—0.5% Li | 311 | A |
| 29 | Ag—1% Li | 304 | A |
| 30 | Ag—2% Li | 288 | A |
| 31 | Ag—0.1% Li—0.005% Bi | 317 | A |
| 32 | Ag—0.1% Li—0.01% Bi | 316 | A |
| 33 | Ag—0.1% Li—0.05% Bi | 310 | A |
| 34 | Ag—0.1% Li—0.1% Bi | 302 | A |
| 35 | Ag—0.1% Li—0.2% Bi | 286 | A |
| 36 | Ag—0.5% Li—0.005% Bi | 311 | A |
| 37 | Ag—0.5% Li—0.01% Bi | 310 | A |
| 38 | Ag—0.5% Li—0.05% Bi | 304 | A |
| 39 | Ag—0.5% Li—0.1% Bi | 296 | A |
| 40 | Ag—0.5% Li—0.2% Bi | 280 | A |
| 41 | Ag—1% Li—0.005% Bi | 303 | A |
| 42 | Ag—1% Li—0.01% Bi | 302 | A |
| 43 | Ag—1% Li—0.05% Bi | 296 | A |
| 44 | Ag—1% Li—0.1% Bi | 288 | A |
| 45 | Ag—1% Li—0.2% Bi | 272 | A |
| 46 | Ag—2% Li—0.005% Bi | 287 | A |
| 47 | Ag—2% Li—0.01% Bi | 286 | A |
| 48 | Ag—2% Li—0.05% Bi | 280 | A |
| 49 | Ag—2% Li—0.1% Bi | 272 | A |
| 50 | Ag—2% Li—0.2% Bi | 256 | A |
| 51 | Ag—0.1% Li—0.1% Nd | 313 | A |
| 52 | Ag—0.1% Li—0.2% Nd | 307 | A |
| 53 | Ag—0.1% Li—0.5% Nd | 292 | A |
| 54 | Ag—0.1% Li—1% Nd | 265 | A |
| 55 | Ag—0.1% Li—2% Nd | 213 | A |
| 56 | Ag—0.5% Li—0.1% Nd | 307 | A |
| 57 | Ag—0.5% Li—0.2% Nd | 301 | A |
| 58 | Ag—0.5% Li—0.5% Nd | 286 | A |
| 59 | Ag—0.5% Li—1% Nd | 259 | A |
| 60 | Ag—0.5% Li—2% Nd | 207 | A |
| 61 | Ag—1% Li—0.1% Nd | 299 | A |
| 62 | Ag—1% Li—0.2% Nd | 294 | A |
| 63 | Ag—1% Li—0.5% Nd | 278 | A |
| 64 | Ag—1% Li—1% Nd | 252 | A |
| 65 | Ag—1% Li—2% Nd | 199 | A |
| 66 | Ag—2% Li—0.1% Nd | 283 | A |
| 67 | Ag—2% Li—0.2% Nd | 278 | A |
| 68 | Ag—2% Li—0.5% Nd | 262 | A |
| 69 | Ag—2% Li—1% Nd | 236 | A |
| 70 | Ag—2% Li—2% Nd | 284 | A |
| 71 | Ag—0.1% Li—0.1% Cu | 315 | A |
| 72 | Ag—0.1% Li—0.2% Cu | 312 | A |
| 73 | Ag—0.1% Li—0.5% Cu | 304 | A |
| 74 | Ag—0.1% Li—1% Cu | 290 | A |
| 75 | Ag—0.1% Li—2% Cu | 262 | A |
| 76 | Ag—0.1% Li—3% Cu | 234 | A |
| 77 | Ag—0.5% Li—0.1% Cu | 309 | A |

TABLE 7-continued

| Sample No. | Film Composition | Thermal conductivity (W/(m·K)) | |
|---|---|---|---|
| 78 | Ag—0.5% Li—0.2% Cu | 306 | A |
| 79 | Ag—0.5% Li—0.5% Cu | 298 | A |
| 80 | Ag—0.5% Li—1% Cu | 284 | A |
| 81 | Ag—0.5% Li—2% Cu | 256 | A |
| 82 | Ag—0.5% Li—3% Cu | 228 | A |
| 83 | Ag—1% Li—0.1% Cu | 301 | A |
| 84 | Ag—1% Li—0.2% Cu | 298 | A |
| 85 | Ag—1% Li—0.5% Cu | 290 | A |
| 86 | Ag—1% Li—1% Cu | 276 | A |
| 87 | Ag—1% Li—2% Cu | 248 | A |
| 88 | Ag—1% Li—3% Cu | 220 | A |
| 89 | Ag—2% Li—0.1% Cu | 286 | A |
| 90 | Ag—2% Li—0.2% Cu | 283 | A |
| 91 | Ag—2% Li—0.5% Cu | 275 | A |
| 92 | Ag—2% Li—1% Cu | 261 | A |
| 93 | Ag—2% Li—2% Cu | 233 | A |
| 94 | Ag—2% Li—3% Cu | 205 | A |
| 95 | Ag—0.1% Li—0.1% Au | 316 | A |
| 96 | Ag—0.1% Li—0.2% Au | 314 | A |
| 97 | Ag—0.1% Li—0.5% Au | 307 | A |
| 98 | Ag—0.1% Li—1% Au | 296 | A |
| 99 | Ag—0.1% Li—2% Au | 274 | A |
| 100 | Ag—0.1% Li—3% Au | 252 | A |
| 101 | Ag—0.5% Li—0.1% Au | 310 | A |
| 102 | Ag—0.5% Li—0.2% Au | 307 | A |
| 103 | Ag—0.5% Li—0.5% Au | 301 | A |
| 104 | Ag—0.5% Li—1% Au | 290 | A |
| 105 | Ag—0.5% Li—2% Au | 268 | A |
| 106 | Ag—0.5% Li—3% Au | 246 | A |
| 107 | Ag—1% Li—0.1% Au | 302 | A |
| 108 | Ag—1% Li—0.2% Au | 300 | A |
| 109 | Ag—1% Li—0.5% Au | 293 | A |
| 110 | Ag—1% Li—1% Au | 282 | A |
| 111 | Ag—1% Li—2% Au | 260 | A |
| 112 | Ag—1% Li—3% Au | 238 | A |
| 113 | Ag—2% Li—0.1% Au | 286 | A |
| 114 | Ag—2% Li—0.2% Au | 284 | A |
| 115 | Ag—2% Li—0.5% Au | 278 | A |
| 116 | Ag—2% Li—1% Au | 267 | A |
| 117 | Ag—2% Li—2% Au | 245 | A |
| 118 | Ag—2% Li—3% Au | 223 | A |
| 119 | Ag—1% Li—0.2% Bi—0.5% Nd | 246 | A |
| 120 | Ag—2% Li—0.2% Bi—0.5% Nd | 230 | A |
| 121 | Ag—4% Li—0.2% Bi—0.5% Nd | 199 | A |
| 122 | Ag—1% Li—0.2% Bi—2% Cu | 216 | A |
| 123 | Ag—2% Li—0.2% Bi—2% Cu | 201 | A |
| 124 | Ag—4% Li—0.2% Bi—2% Cu | 170 | A |
| 125 | Ag—1% Li—0.2% Bi—2% Au | 228 | A |
| 126 | Ag—2% Li—0.2% Bi—2% Au | 213 | A |
| 127 | Ag—4% Li—0.2% Bi—2% Au | 182 | A |
| 128 | Ag—1% Li—0.5% Nd—2% Cu | 222 | A |
| 129 | Ag—1% Li—0.5% Nd—2% Au | 234 | A |
| 130 | Ag—2% Li—0.5% Nd—2% Cu | 206 | A |
| 131 | Ag—2% Li—0.5% Nd—2% Au | 218 | A |
| 132 | Ag—4% Li—0.5% Nd—2% Cu | 175 | A |
| 133 | Ag—4% Li—0.5% Nd—2% Au | 187 | A |
| 134 | Ag—1% Li—0.2% Bi—0.5% Nd—2% Cu | 202 | A |
| 135 | Ag—1% Li—0.2% Bi—0.5% Nd—2% Au | 190 | A |
| 136 | Ag—1% Li—0.2% Bi—0.5% Nd—1% Cu—1% Au | 196 | A |
| 137 | Ag—2% Li—0.2% Bi—0.5% Nd—2% Cu | 186 | A |
| 138 | Ag—2% Li—0.2% Bi—0.5% Nd—2% Au | 174 | A |
| 139 | Ag—2% Li—0.2% Bi—0.5% Nd—1% Cu—1% Au | 180 | A |

What is claimed is:

1. A semi-reflective film or reflective film for an optical information recording medium, comprising a Ag based alloy, wherein the Ag based alloy comprises
0.01 to 10 atomic percent of Li, and
0.005 to 0.8 atomic percent of Bi.

2. The semi-reflective film or reflective film according to claim 1, wherein the Ag based alloy further comprises 0:1 to 2 atomic percent in total of at least one rare earth metal element selected from the group consisting of Sc, Y, La, Ce, Pr, Nd, Pm, Sm, Eu, Gd, Th, Dy, Ho, Er, Tm, Yb and Lu.

3. The semi-reflective film or reflective film according to claim 2, wherein the rare earth metal element is at least one of Nd and Y.

4. The semi-reflective film or reflective film according to claim 1, wherein the Ag based alloy further comprises 0.1 to 3 atomic percent in total of at least one element selected from the group consisting of Cu, Au, Rh, Pd and Pt.

5. An optical information recording medium comprising the semi-reflective film of claim 1.

6. An optical information recording medium comprising the reflective film of claim 1.

7. A Ag based alloy sputtering target, comprising:
Ag,
0.01 to 10 atomic percent of Li, and
0.02 to 8 atomic percent of Bi.

8. The Ag based alloy sputtering target according to claim 7, wherein the atomic percent of Bi is 0.1 to 6.

9. The Ag based alloy sputtering target according to claim 7, further comprising 0.1 to 2 atomic percent in total of at least one rare earth metal element selected from the group consisting os Sc, Y, La, Ce, Pr, Nd, Pm, Sm, Eu, Gd, Th, Dy, Ho, Er, Tm, Yb and Lu.

10. The Ag based alloy sputtering target according to claim 9, wherein the rare earth metal element is at least one of Nd and Y.

11. The Ag based alloy sputtering target according to claim 7, further comprising 0.1 to 3 atomic percent in total of at least one element selected from the group consisting of Cu, Au, Rh, Pd and Pt.

12. The semi-reflective film or reflective film for an optical information recording medium according to claim 1, wherein the atomic percent of Bi is 0.01 to 0.6.

13. The semi-reflective film or reflective film for an optical information recording medium according to claim 12, wherein the atomic percent of Bi is 0.05 to 0.4.

14. The semi-reflective film or reflective film according to claim 2, wherein the atomic percent in total of at least one rare earth metal element selected from the group consisting of Sc, Y, La, Ce, Pr, Nd, Pm, Sm, Eu, Gd, Th, Dy, Ho, Er, Tm, Yb and Lu is 0.2 to 1.

15. The semi-reflective film or reflective film according to claim 14, wherein the atomic percent in total of at least one rare earth metal element selected from the group consisting of Sc, Y, La, Ce, Pr, Nd, Pm, Sm, Eu, Gd, Th, Dy, Ho, Er, Tm, Yb and Lu is 0.3 to 0.5.

16. The semi-reflective film or reflective film according to claim 4, wherein the atomic percent in total of at least one element selected from the group consisting of Cu, Au, Rh, Pd and Pt is 0.2 to 2.

17. The semi-reflective film or reflective film according to claim 16, wherein the atomic percent in total of at least one element selected from the group consisting of Cu, Au, Rh, Pd and Pt is 0.3 to 1.

18. The Ag based alloy sputtering target according to claim 8, wherein the atomic percent of Bi is 0.2 to 4.

* * * * *